(12) United States Patent
Lee et al.

(10) Patent No.: US 10,475,647 B2
(45) Date of Patent: Nov. 12, 2019

(54) LASER CRYSTALLIZATION DEVICE AND METHOD

(71) Applicant: SAMSUNG DISPLAY CO., LTD., Yongin-si, Gyeonggi-Do (KR)

(72) Inventors: Hong Ro Lee, Seongnam-si (KR); Rae Chul Park, Asan-si (KR); Chung Hwan Lee, Seoul (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 51 days.

(21) Appl. No.: 15/465,707

(22) Filed: Mar. 22, 2017

(65) Prior Publication Data

US 2017/0278708 A1    Sep. 28, 2017

(30) Foreign Application Priority Data

Mar. 23, 2016  (KR) .................. 10-2016-0034766

(51) Int. Cl.
*H01L 21/02* (2006.01)
*B23K 26/064* (2014.01)
(Continued)

(52) U.S. Cl.
CPC .... *H01L 21/02675* (2013.01); *B23K 26/0006* (2013.01); *B23K 26/0608* (2013.01);
(Continued)

(58) Field of Classification Search
CPC .......... H01L 21/02675; B23K 26/0643; B23K 26/704
See application file for complete search history.

(56) References Cited

U.S. PATENT DOCUMENTS 5,173,583 A * 12/1992 de Contencin ........ B23K 26/06
                                                                                    219/121.74
6,011,654 A *  1/2000 Schweizer ............ B23K 26/06
                                                                                    359/629
(Continued)

FOREIGN PATENT DOCUMENTS

DE    102010036161 A1 *  3/2012
JP    2000-133593 A    *  5/2000
(Continued)

OTHER PUBLICATIONS

Machine translation of Japan Patent document No. 2011-204,912-A, Nov. 2018.*

(Continued)

*Primary Examiner* — Geoffrey S Evans
(74) *Attorney, Agent, or Firm* — F. Chau & Associates, LLC

(57) ABSTRACT

A laser crystallization device includes a laser oscillator, a stage, and a reflection unit. The stage is configured to support a substrate with a target film disposed on the substrate. The laser oscillator is configured to irradiate an incident laser beam on the target film. The stage is configured to move the substrate such that the incident laser beam scans the target film. The incident laser beam is reflected from the target film to generate a reflected laser beam. The reflection unit includes at least two reflection mirrors positioned at a path of the reflected laser beam. The reflection unit is configured to re-irradiate the reflected laser beam on the target film two or more times through a plurality of paths that are different from a path of the incident laser beam.

16 Claims, 16 Drawing Sheets

(51) Int. Cl.
*B23K 26/70* (2014.01)
*H01L 27/12* (2006.01)
*B23K 26/00* (2014.01)
*B23K 26/06* (2014.01)
*B23K 26/08* (2014.01)
*B23K 26/352* (2014.01)
*G02B 5/00* (2006.01)
*B23K 101/40* (2006.01)
*B23K 103/16* (2006.01)
*B23K 103/00* (2006.01)

(52) U.S. Cl.
CPC ........ *B23K 26/0643* (2013.01); *B23K 26/083* (2013.01); *B23K 26/352* (2015.10); *B23K 26/704* (2015.10); *H01L 27/1274* (2013.01); *B23K 2101/40* (2018.08); *B23K 2103/172* (2018.08); *B23K 2103/56* (2018.08); *G02B 5/003* (2013.01); *H01L 21/02532* (2013.01); *H01L 21/02691* (2013.01)

(56) References Cited

U.S. PATENT DOCUMENTS

| | | | | |
|---|---|---|---|---|
| 2010/0173480 | A1* | 7/2010 | Yamazaki | B23K 26/0838 438/487 |
| 2012/0238111 | A1* | 9/2012 | Jennings | B23K 26/0604 438/795 |
| 2014/0017861 | A1* | 1/2014 | Kim | H01L 29/6675 438/166 |
| 2014/0202213 | A1* | 7/2014 | Park | C01B 33/021 65/348 |
| 2015/0224601 | A1* | 8/2015 | Mitra | B23K 37/006 219/121.6 |
| 2016/0284546 | A1* | 9/2016 | Cho | B23K 26/352 |
| 2017/0144251 | A1* | 5/2017 | Song | H01L 21/268 |
| 2017/0367167 | A1* | 12/2017 | Lambert | G02B 5/003 |
| 2018/0246321 | A1* | 8/2018 | Campton | B22F 3/1055 |

FOREIGN PATENT DOCUMENTS

| | | |
|---|---|---|
| JP | 2001-053021 | 2/2001 |
| JP | 2011-204912 A * | 10/2011 |
| KR | 10-2004-0106240 | 12/2004 |
| KR | 10-2014-0008127 | 1/2014 |

OTHER PUBLICATIONS

Machine translation of German Patent No. 102010036161-A1, Nov. 2018.*

Kupinski et al., "Optical Systems: Transmissive high-energy laser optics: Manufacturing and testing considerations", LaserFocusWorld, http://www.laserfocusworld.com/articles/print/volume-50/issue-09/features/optical-systems-transmissive-high-energy-laser-optics-manufacturing-and-testing-considerations.html, Sep. 8, 2014.

Ivlev et al. "Liquid phase reflectivity under conditions of laser-induced silicon melting." Electronic and Optical Properties of Semiconductors. Semiconductors. vol. 34. Issue 7, Jul. 2000. pp. 759-762.

* cited by examiner

LASER CRYSTALLIZATION DEVICE AND METHOD

CROSS-REFERENCE TO RELATED APPLICATION

This application claims priority under 35 U.S.C. § 119 to Korean Patent Application No. 10-2016-0034766, filed in the Korean Intellectual Property Office on Mar. 23, 2016, the disclosure of which is incorporated by reference herein in its entirety.

TECHNICAL FIELD

The present invention relates to a laser crystallization device. More particularly, the present invention relates to a laser crystallization device and a laser crystallization method.

DISCUSSION OF THE RELATED ART

Thin film transistors (TFTs), including semiconductor layers, are provided at pixels of active matrix display devices. Examples of active matrix display devices include organic light emitting diode (OLED) display devices and liquid crystal display (LCD) devices. The semiconductor layer may include amorphous silicon or a polycrystalline silicon. Polycrystalline silicon may have a high mobility and may be included in the OLED display device for controlling the brightness of emission layers in the OLEDs depending on the current flowing through the OLEDs.

Polycrystalline silicon may be formed by irradiating an amorphous silicon layer with a laser beam and annealing the amorphous silicon layer. A laser crystallization device may be used to form polycrystalline silicon.

SUMMARY

According to an exemplary embodiment of the present invention, a laser crystallization device includes a laser oscillator, a stage, and a reflection unit. The stage is configured to support a substrate with a target film disposed on the substrate. The laser oscillator is configured to irradiate an incident laser beam on the target film. The stage is configured to move the substrate such that the incident laser beam scans the target film. The incident laser beam is reflected from the target film to generate a reflected laser beam. The reflection unit includes at least two reflection mirrors positioned at a path of the reflected laser beam. The reflection unit is configured to re-irradiate the reflected laser beam on the target film two or more times through a plurality of paths that are different from a path of the incident laser beam.

According to an exemplary embodiment of the present invention, a laser crystallization method includes crystallizing a target film by irradiating a laser beam on the target film through a first path, crystallizing the target film by irradiating the laser beam, after the laser beam is reflected off the target film, back on the target film one or more times by using a reflection unit through a second path different from the first path, and moving the target film through a stage such that the laser beam scans the target film.

According to an exemplary embodiment of the present invention, a laser crystallization device includes a laser oscillator, a stage configured to support a substrate with a target film disposed thereon, wherein the laser oscillator irradiates an incident laser beam on the target film, wherein the stage is configured to move the substrate such that the incident laser beam scans the target film, and wherein the incident laser beam is reflected from the target film to generate a reflected laser beam, a reflection unit including at least two reflection mirrors positioned at a path of the reflected laser beam, and wherein the reflection unit is configured to re-irradiate the reflected laser beam on the target film one or more times through a different path from a path of the incident laser beam, and a laser canceller configured to trap and cancel the reflected laser beam after the reflected laser beam has passed through the reflection unit and is next reflected from the target film.

According to an exemplary embodiment of the present invention, a laser crystallization method includes crystallizing a target film by irradiating a laser beam to the target film, crystallizing the target film by re-irradiating the laser beam, after the laser beam has been reflected from the target film, back on the target film one or more times by using a reflection unit, wherein the re-irradiated laser beam travels toward the target film through a different path from a path of the incident laser beam, cancelling the laser beam by disposing a laser canceller at a path of the re-irradiated laser beam after the re-irradiated laser beam is last reflected from the target film, and moving the target film through a stage such that the incident laser beam scans the target film.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1A:
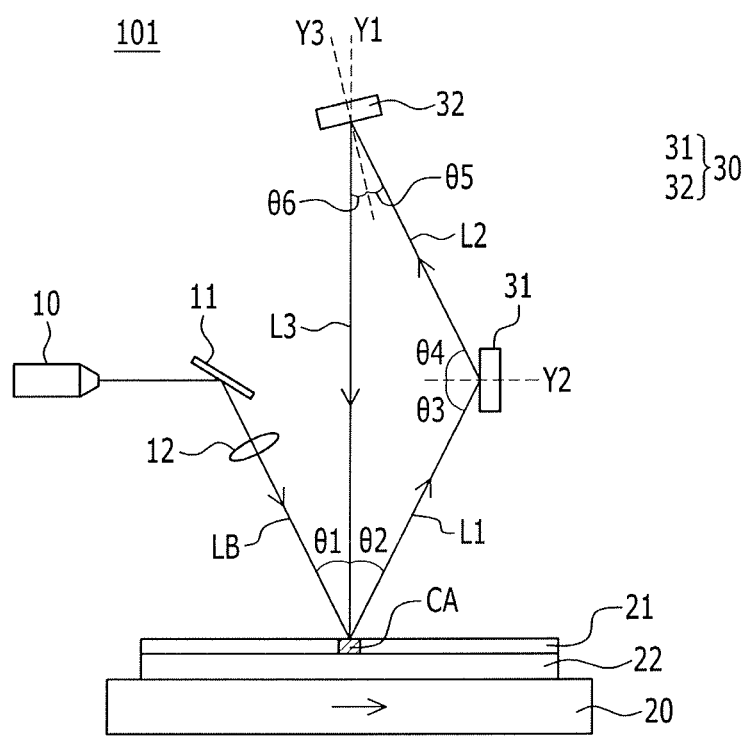
FIG. 1A and FIG. 1B are diagrams illustrating a laser crystallization device according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

It will be understood that when an element such as a layer or substrate is referred to as being "on" another element, it can be directly on the other element, or intervening elements may also be present therebetween.

Figure 1B:
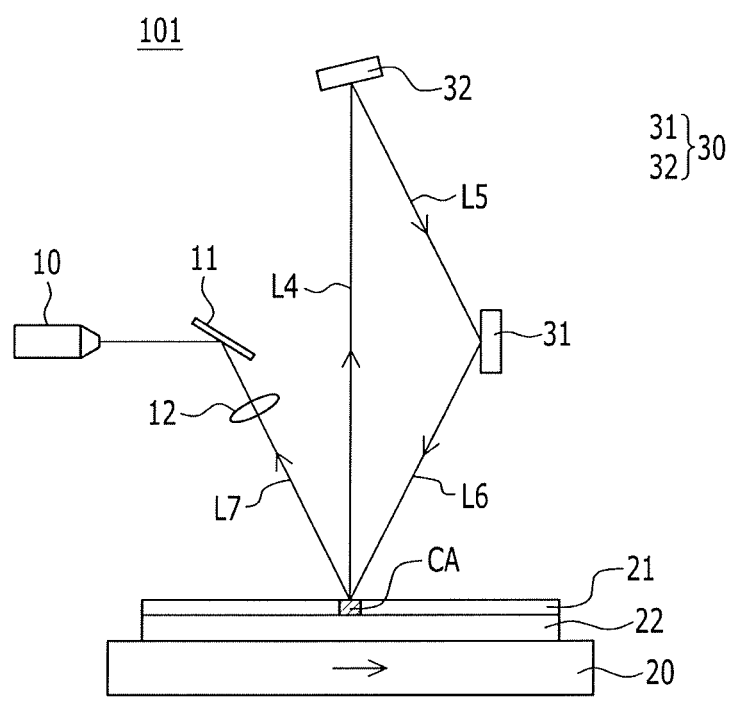
Figure 2A:
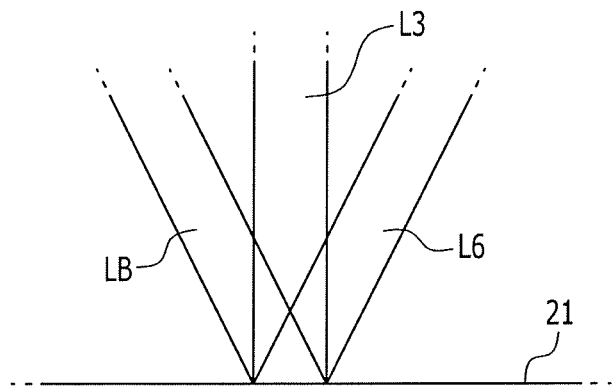
FIG. 2A and FIG. 2B are magnified views illustrating a portion of the laser crystallization device shown in FIG. 1A, according to exemplary embodiments of the present invention.
Figure 2B:
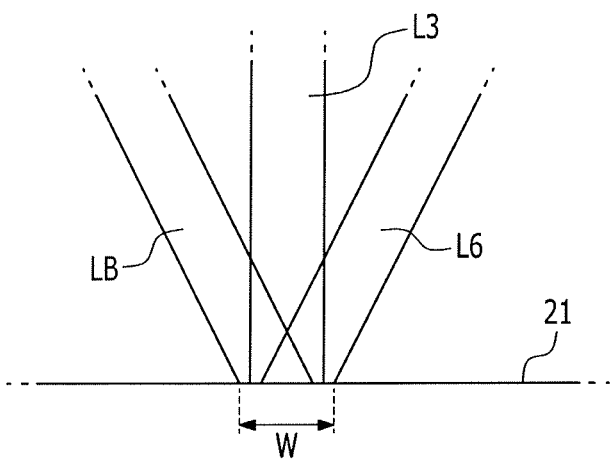

FIG. 1A and FIG. 1B are diagrams illustrating a laser crystallization device according to an exemplary embodiment of the present invention. FIG. 2A and FIG. 2B are magnified views illustrating a portion of the laser crystallization device shown in FIG. 1A, according to exemplary embodiments of the present invention.

Refer to FIG. 1A and FIG. 1B, a laser crystallization device 101 includes a laser oscillator 10, a stage 20 for supporting a substrate 22 and a reflection unit 30. A target film 21 may be disposed on the substrate 22. The target film 21 may be irradiated by an incident laser beam LB emitted from the laser oscillator 10. The reflection unit 30 may be disposed on a path of a first reflected laser beam L1 reflected from the target film 21.

The incident laser beam LB emitted from the laser oscillator 10 may be an excimer laser beam, or the like. The incident laser beam LB may crystallize the target film 21. The target film 21 may be an amorphous silicon thin film, which may be formed through a chemical vapor deposition method, a sputtering method, or a vacuum deposition method.

An incident mirror 11 for changing a direction of the incident laser beam LB and a condensing lens 12 for condensing the incident laser beam may be disposed between the laser oscillator 10 and the target film 21. Positions of the laser oscillator 10, the incident mirror 11, and the condensing lens 12 may be fixed. The incident laser beam LB may scan the target film 21 by having the stage 20 move the substrate 22.

Since a silicon surface of the target film 21 is melted by the incident laser beam LB to be changed into a metallic structure, the reflection of the target film 21 increases. Accordingly, during the laser crystallization process, the first reflected laser beam L1 is generated, and the energy of the first reflected laser beam L1 is about 60% of the energy of the incident laser beam LB. For example, about 40% of the energy of the incident laser beam LB is used for the crystallization of the target film 21, and the remaining energy of the laser beam LB is reflected.

An incident angle $\theta 1$ of the incident laser beam LB and a reflection angle $\theta 2$ of the first reflected laser beam L1 with respect to the target film 21 are the same. The incident angle $\theta 1$ may mean an inclination angle of the incident laser beam LB with respect to a first normal line Y1 of the substrate 22. It is understood that the first normal line Y1 is normal (e.g., perpendicular) to a surface of the substrate 22 and/or the target film 21. The reflection angle $\theta 2$ may mean an inclination angle of the first reflected laser beam L1 with respect to the first normal line Y1.

The reflection unit 30 serves to reflect the first reflected laser beam L1 to re-irradiate the target film 21. The reflection unit 30 includes a first reflection mirror 31 and a second reflection mirror 32 spaced apart from each other. The first reflection mirror 31 and the second reflection mirror 32 may each include a flat mirror.

The first reflection mirror 31 is positioned at the path of the first reflected laser beam L1, and reflects the first reflected laser beam L1 upward to generate a second reflected laser beam L2 away from the target film 21.

An incident angle $\theta 3$ of the first reflected laser beam L1 and a reflection angle $\theta 4$ of the second reflected laser beam L2 with respect to the first reflection mirror 31 are equal to each other. The incident angle $\theta 3$ may mean an inclination angle of the first reflected laser beam L1 with respect to a second normal line Y2, perpendicular to a surface of the first reflection mirror 31, and the reflection angle $\theta 4$ may mean an inclination angle of the second reflected laser beam L2 with respect to the second normal line Y2.

The second reflection mirror 32 is positioned at a path of the second reflected laser beam L2, and reflects the second reflected laser beam L2 toward the target film 21 to generate a third reflected laser beam L3. The third reflected laser beam L3 may be re-irradiated to the target film 21. The third reflected laser beam L3 is a laser beam that is incident in a direction perpendicular to the target film 21, and the path of travel of the third reflected laser beam L3 may be parallel to the first normal line Y1.

An incident angle $\theta 5$ of the second reflected laser beam L2 and a reflection angle $\theta 6$ of the third reflected laser beam L3, with respect to the second reflection mirror 32, are equal to each other. The incident angle $\theta 5$ may mean an inclination angle of the second reflected laser beam L2 with respect to a third normal line Y3, perpendicular to a surface of the second reflection mirror 32. The reflection angle $\theta 6$ may mean an inclination angle of the third reflected laser beam L3 with respect to the third normal line Y3.

When the third reflected laser beam L3 is incident on the target film 21, a portion of the third reflected laser beam L3 is reflected to become a fourth reflected laser beam L4. The energy of the fourth reflected laser beam L4 is about 60% of that of the third reflected laser beam L3, and a path of the fourth reflected laser beam L4 may be parallel to the first normal line Y1.

The second reflection mirror 32 reflects the fourth reflected laser beam L4 toward the first reflection mirror 31 to generate a fifth reflected laser beam L5. A path of travel of the fifth reflected laser beam L5 may be the same as that of the second reflected laser beam L2. The first reflection mirror 31 reflects the fifth reflected laser beam L5 toward the target film 21 to generate a sixth reflected laser beam L6. The sixth reflected laser beam L6 may be irradiated on the target film 21. A path of travel of the sixth reflected laser beam L6 may be the same as that of the first reflected laser beam L1.

When the sixth reflected laser beam L6 is incident on the target film 21, a portion of the sixth reflected laser beam L6 is reflected to become a seventh reflected laser beam L7. The energy of the seventh reflected laser beam L7 is about 60% of that of the sixth reflected laser beam L6, and a path of travel of the seventh reflected laser beam L7 may be the same as that of the incident laser beam LB.

As such, the reflection unit 30 controls the third reflected laser beam L3 and the sixth reflected laser beam L6 to be sequentially irradiated to a position of the target film 21 on which the incident laser beam LB is irradiated. In this case, the third reflected laser beam L3 and the sixth reflected laser beam L6 are irradiated on the target film 21 through different travel paths.

Accordingly, a crystallization area (CA) of the target film 21 is crystallized by the incident laser beam LB, and it is additionally crystallized by the third reflected laser beam L3 and the sixth reflected laser beam L6. As a result, the laser crystallization device 101, according to an exemplary embodiment of the present invention, may increase a crystallization ratio of the target film 21, and may decrease a time used for the crystallization of the target film 21.

When it is assumed that laser reflectance of the target film 21 is about 60%, in a conventional laser crystallization device using no reflection laser, about 40% of the energy of the incident laser beam LB is used for the crystallization. However, in the laser crystallization device 101, about 78.4% of the energy of the incident laser beam LB is used for the crystallization. The laser crystallization device 101 increases utilization of the energy of the laser incident laser beam LB. Accordingly, the output of the laser oscillator 10 may be reduced and the operation costs of the laser crystallization device 101 may be reduced.

The seventh reflected laser beam L7 progresses to the laser oscillator 10 via the condensing lens 12 and the incident mirror 11. When it is assumed that the laser reflectance of the target film 21 is about 60%, the energy of the seventh reflected laser beam L7 is about 21.6% of energy of the incident laser beam LB, which is a low level of energy. Accordingly, in the laser crystallization device 101, damage of the condensing lens 12 due to the irradiation of the seventh reflected laser beam L7 may be reduced. In addition the oscillation instability of the laser beam emitted from the laser oscillator 10 may be minimized by reducing the energy of the reflected laser beam entering the laser oscillator 10.

In the aforementioned exemplary embodiment of the present invention, irradiation areas of the third reflected laser beam L3 and the sixth reflected laser beam L6 may be identical to or partially overlap an irradiation area of the incident laser beam LB. FIG. 2A illustrates an example when the irradiation areas of the third reflected laser beam L3 and the sixth reflected laser beam L6 are the same as the irradiation area of the incident laser beam LB. FIG. 2B illustrates an example when the irradiation areas of the third reflected laser beam L3 and the sixth reflected laser beam L6 partially overlap the irradiation area of the incident laser beam LB. When the paths of travel of the fourth, fifth, and sixth reflected laser beams L4, L5, and L6 are respectively the same as those of the third, second and first reflected laser beams L3, L2, and L1, as shown in FIG. 2A, the irradiation area of the third reflected laser beam L3 and the irradiation area of the sixth reflected laser beam L6 are identical to the irradiation area of the incident laser beam LB.

The first reflection mirror 31 and/or the second reflection mirror 32 may have a tilt angle of about 0.5° or less with respect to a reference position. The reference position means a position at which the irradiation area of the third reflected laser beam L3 and the irradiation area of the sixth reflected laser beam L6 are identical to the irradiation area of the incident laser beam LB. In this case, the paths of the fourth, fifth, and sixth reflected laser beams L4, L5, and L6 are respectively deviated from those of the third, second, and first reflected laser beams L3, L2, and L1.

In this case, as shown in FIG. 2B, the irradiation area of the third reflected laser beam L3 may partially overlap the irradiation area of the incident laser beam LB, and the irradiation area of the sixth reflected laser beam L6 may partially overlap the irradiation area of the incident laser beam LB. In the case of FIG. 2B, a width (W) of the laser beam (e.g., the width (W) may refer to the combined width of the laser beam LB, the third reflected laser beam L3 and the sixth reflected laser beam L6) irradiated on the target film 21 may increase (e.g., the width (W) may become greater than the width of the incident laser beam LB on the target film 21.

Figure 3:
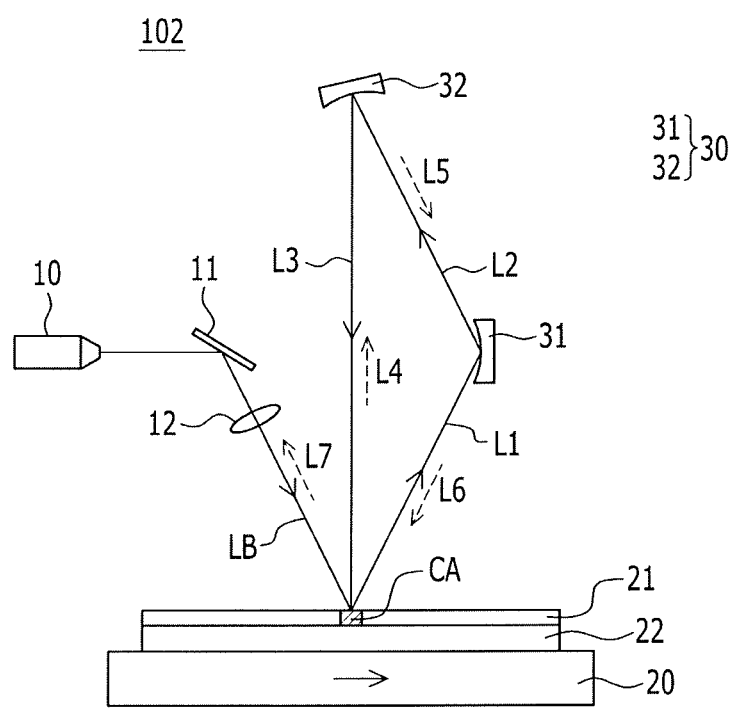
FIG. 3 is a diagram illustrating a laser crystallization device according to an exemplary embodiment of the present invention.

FIG. 3 is a diagram illustrating a laser crystallization device according to an exemplary embodiment of the present invention.

Referring to FIG. 3, in a laser crystallization device 102, according to an exemplary embodiment of the present invention, the first reflection mirror 31 and/or the second reflection mirror 32 includes a concave mirror. For example, both the first reflection mirror 31 and the second reflection mirror 32 may respectively include a concave mirror, and a mirror positioned at the last of the travel paths of a plurality of reflected laser beams may be a concave reflection mirror.

In FIG. 3, the reflected laser beams L1-L7 sequentially pass the first reflection mirror 31, the second reflection mirror 32, the target film 21, the second reflection mirror 32, the first reflection mirror 31, and the target film 21. Thus, the first reflection mirror 31 may include a concave mirror and the second reflection mirror 32 may include a flat mirror. In FIG. 3, it is exemplarily illustrated that both the first reflection mirror 31 and the second reflection mirror 32 respectively include a concave mirror.

The incident laser beam LB is focused on a surface of the target film 21 by the condensing lens 12, and the incident laser beam LB may become dim because of being diffused while being reflected several times by the reflection unit 30. At least one of the first reflection mirror 31 and the second reflection mirror 32, which includes a concave mirror, focuses the reflected laser beam. Accordingly, the third reflected laser beam L3 and the sixth reflected laser beam L6 that are re-irradiated to the target film 21 may be focused on the surface of the target film 21 by the concave mirror.

With the exception of the concavity of the first and second reflection mirrors 31 and 32 of the reflection unit 30, the configuration of the laser crystallization device 102 may be the same as that of the laser crystallization device 101. Accordingly, a repeated description thereof will be omitted for brevity.

Figure 4A:
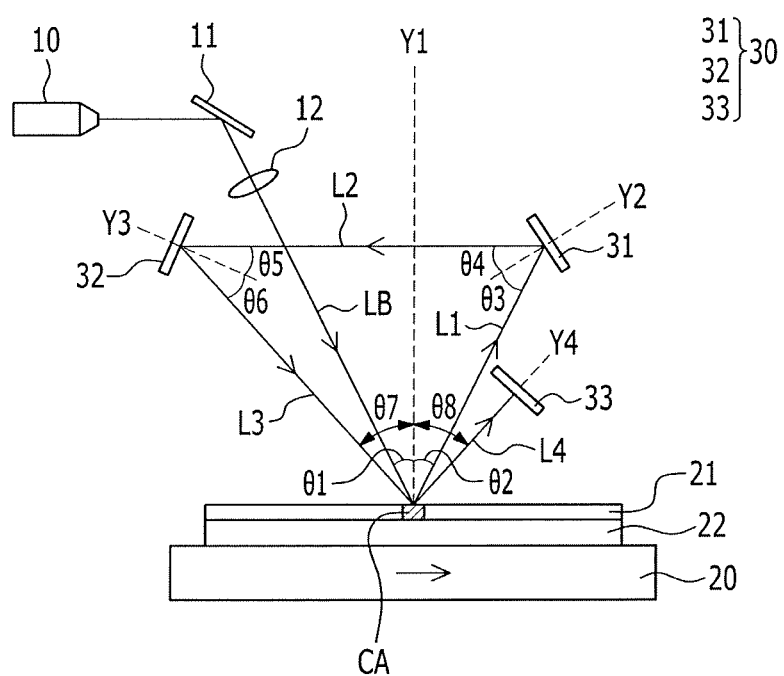
FIG. 4A and FIG. 4B are diagrams illustrating a laser crystallization device according to an exemplary embodiment of the present invention.
Figure 4B:
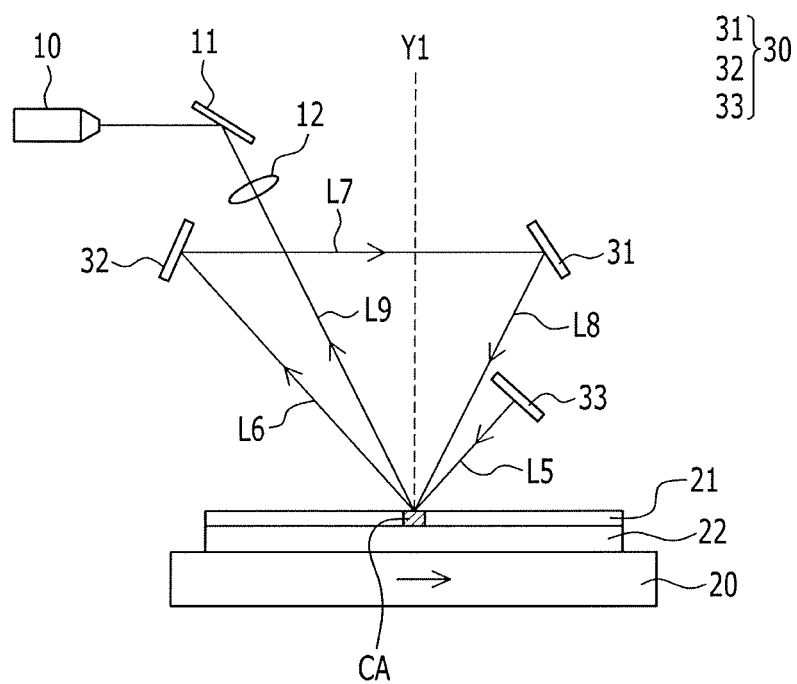

FIG. 4A and FIG. 4B are diagrams illustrating a laser crystallization device according to an exemplary embodiment of the present invention.

Referring to FIG. 4A and FIG. 4B, in a laser crystallization device 103, according to an exemplary embodiment of the present invention, the reflection unit 30 includes the first reflection mirror 31, the second reflection mirror 32, and a third reflection mirror 33. The first reflection mirror 31, the second reflection mirror 32, and the third reflection mirror 33 may include a flat mirror, respectively.

The first reflection mirror 31 is positioned at the path of travel of the first reflected laser beam L1, and reflects the first reflected laser beam L1 in a horizontal direction to generate the second reflected laser beam L2. The second reflected laser beam L2 may have a path of travel parallel to the surface of the target film 21.

The incident angle $\theta3$ of the first reflected laser beam L1 and the reflection angle $\theta4$ of the second reflected laser beam L2 are the same with respect to the first reflection mirror 31.

The incident angle $\theta 3$ may mean the inclination angle of the first reflected laser beam L1 with respect to the second normal line Y2, which is perpendicular to the surface of the first reflection mirror 31. The reflection angle $\theta 4$ may mean the inclination angle of the second reflected laser beam L2 with respect to the second normal line Y2.

The second reflection mirror 32 is positioned at the path of travel of the second reflected laser beam L2, and reflects the second reflected laser beam L2 toward the target film 21 to generate the third reflected laser beam L3 that is re-irradiated to the target film 21. The first reflection mirror 31 and the second reflection mirror 32 are spaced apart from each other along a direction parallel to the surface of the target film 21.

An incident angle $\theta 5$ of the second reflected laser beam L2 and a reflection angle $\theta 6$ of the third reflected laser beam L3 are the same with respect to the second reflection mirror 32. The incident angle $\theta 5$ may mean the inclination angle of the second reflected laser beam L2 with respect to the third normal line Y3, which is perpendicular to the surface of the second reflection mirror 32. The reflection angle $\theta 6$ may mean the inclination angle of the third reflected laser beam L3 with respect to the third normal line Y3.

When the third reflected laser beam L3 is incident on the target film 21, a portion of the third reflected laser beam L3 is reflected to become the fourth reflected laser beam L4. The energy of the fourth reflected laser beam L4 is about 60% of that of the third reflected laser beam L3.

An incident angle $\theta 7$ of the third incident laser beam L3 and a reflection angle $\theta 8$ of the fourth reflected laser beam L4 are the same with respect to the target film 21. The incident angle $\theta 7$ may mean the inclination angle of the third reflected laser beam L3 with respect to the first normal line Y1, which is perpendicular to a surface of the substrate 22. The reflection angle $\theta 8$ may mean an inclination angle of the fourth reflected laser beam L4 with respect to the first normal line Y1.

In this case, the incident angle $\theta 7$ of the third reflected laser beam L3 is greater than the incident angle $\theta 1$ of the incident laser beam LB, and the reflection angle $\theta 8$ of the fourth reflected laser beam L4 is greater than the reflection angle $\theta 2$ of the first reflected laser beam L1.

The third reflection mirror 33 is positioned at the path of travel of the fourth reflected laser beam L4, and it reflects the fourth reflected laser beam L4 to the target film 21 to generate the fifth reflected laser beam L5. The fifth reflected laser beam L5 may be re-irradiated on the target film 21. The third reflection mirror 33 is positioned to be closer to the target film 21 than the first reflection mirror 31. The path of travel of the fifth reflected laser beam L5 may be the same as that of the fourth reflected laser beam L4. To achieve this, the third reflection mirror 33 is installed at a location so that a fourth normal line Y4, which is perpendicular to a surface of the third reflection mirror 33, is identical to the path of travel of the fourth reflected laser beam L4.

When the fifth reflected laser beam L5 is incident on the target film 21, a portion of the fifth reflected laser beam L5 becomes the sixth reflected laser beam L6. The energy of the sixth reflected laser beam L6 is about 60% of that of the fifth reflected laser beam L5, and a path of travel of the sixth reflected laser beam L6 may be the same as that of the third reflected laser beam L3.

The second reflection mirror 32 reflects the sixth reflected laser beam L6 in the horizontal direction to generate the seventh reflected laser beam L7. A path of travel of the seventh reflected laser beam L7 may be the same as that of the second reflected laser beam L2. The first reflection mirror 31 reflects the seventh reflected laser beam L7 toward the target film 21 to generate an eighth reflected laser beam L8. The eighth reflected laser beam L8 may be re-irradiated on the target film 21. A path of travel of the eighth reflected laser beam L8 may be the same as that of the first reflected laser beam L1.

When the eighth reflected laser beam L8 is incident on the target film 21, a portion of the eighth reflected laser beam L8 is reflected to become a ninth reflected laser beam L9. The energy of the ninth reflected laser beam L9 is about 60% of that of the eighth reflected laser beam L8, and a path of travel of the ninth reflected laser beam L9 may be the same as that of the incident laser beam LB.

The reflection unit 30 controls the third reflected laser beam L3, the fifth reflected laser beam L5, and the eighth reflected laser beam L8 to be sequentially irradiated to the position of the target film 21 on which the incident laser beam LB is irradiated. In this case, the third reflected laser beam L3, the fifth reflected laser beam L5, and the eighth reflected laser beam L8 are irradiated to the target film 21 through different travel paths.

The crystallization area (CA) of the target film 21 is crystallized by the incident laser beam LB, and it is additionally crystallized by the third reflected laser beam L3, the fifth reflected laser beam L5, and the eighth reflected laser beam L8. When it is assumed that the laser reflectance of the target film 21 is about 60%, about 87.7% of the energy of the incident laser beam LB is used for the crystallization when reflected by the reflection unit 30.

The energy of the ninth reflected laser beam L9 toward the laser oscillator 10 is about 12.3% of the energy of the incident laser beam LB, which is a low level of energy. Accordingly, in the laser crystallization device 103, damage of the condensing lens 12 due to the irradiation of the ninth reflected laser beam L9 may be reduced. In addition the oscillation instability of the laser beam emitted from the laser oscillator 10 may be minimized by reducing the energy of the reflected laser beam entering the laser oscillator 10.

In the aforementioned exemplary embodiment of the present invention, irradiation areas of the third reflected laser beam L3, the fifth reflected laser beam L5, and the eighth reflected laser beam L8 may be identical to or partially overlap the irradiation area of the incident laser beam LB.

When the travel paths of the fifth, sixth, seventh, and eighth reflected laser beams (L5, L6, L7, and L8) are the same as those of the fourth, third, second, and first reflected laser beams (L4, L3, L2, and L1), the irradiation areas of the third reflected laser beam L3, the fifth reflected laser beam L5, and the eighth reflected laser beam L8 are the same as that of the incident laser beam LB.

The first reflection mirror 31, the second reflection mirror 32, and/or the third reflection mirror 33 may have a tilt angle of about 0.5° or less with respect to a reference position. The reference position means a position at which irradiation areas of the third reflected laser beam L3, the fifth reflected laser beam L5, and the eighth reflected laser beam L8 are identical to the irradiation area of the incident laser beam LB.

In this case, the travel paths of the fifth, sixth, seventh, and eighth reflected laser beams (L5, L6, L7, and L8) are respectively deviated from those of the fourth, third, second, and first reflected laser beams (L4, L3, L2, and L1). Accordingly, each of the irradiation areas of the third reflected laser beam L3, the fifth reflected laser beam L5, and the eighth reflected laser beam L8 may partially overlap the irradiation area of the incident laser beam LB.

With the exception of the configuration of the reflection unit 30, the configuration of the laser crystallization device 103 may be the same as that of the laser crystallization device 101. Accordingly, a repeated description thereof will be omitted for brevity.

Figure 5:
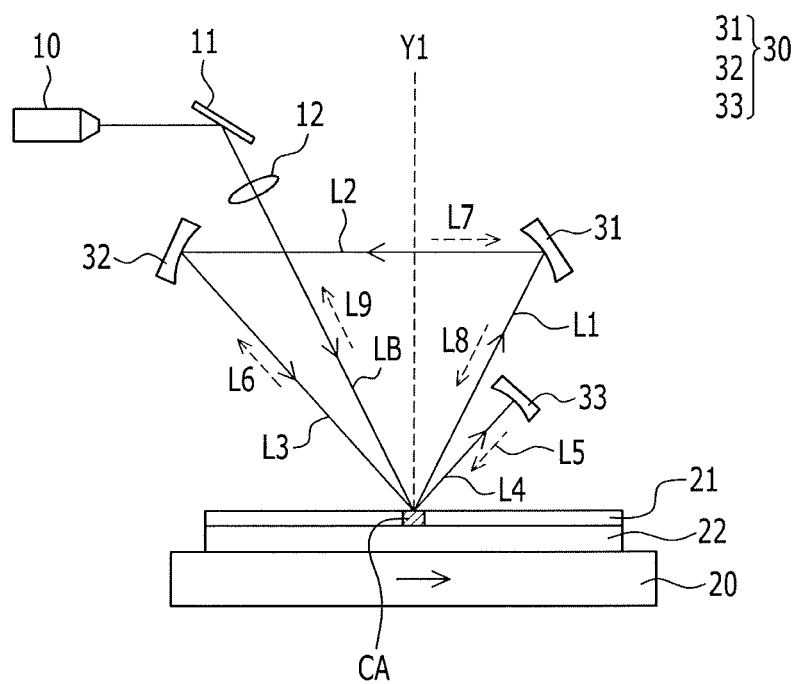
FIG. 5 is a diagram illustrating a laser crystallization device according to an exemplary embodiment of the present invention.

FIG. 5 is a diagram illustrating a laser crystallization device according to an exemplary embodiment of the present invention.

Referring to FIG. 5, in a laser crystallization device 104, according to an exemplary embodiment of the present invention, the first reflection mirror 31, the second reflection mirror 32, and/or the third reflection mirror 33 includes a concave mirror. For example, all of the first to third reflection mirrors 31, 32, and 33 may respectively include a concave mirror, and a mirror positioned at the last of the travel paths of the plurality of reflected laser beams may include a concave reflection mirror.

In FIG. 5, the reflected laser beams (L1-L9) sequentially pass the first reflection mirror 31, the second reflection mirror 32, the target film 21, the third reflection mirror 33, the target film 21, the second reflection mirror 32, the first reflection mirror 31, and the target film 21. The first reflection mirror 31 may include a concave mirror, and the second reflection mirror 32 and the third reflection mirror 33 may respectively include a flat mirror. In FIG. 5, it is exemplarily illustrated that all of the first to third reflection mirrors 31, 32, and 33 respectively include a concave mirror.

The first reflection mirror 31, the second reflection mirror 32, and/or the third reflection mirror 33, which includes a concave mirror, focuses the reflected laser beam. Accordingly, the third reflected laser beam L3, the fifth reflected laser beam L5, and the eighth reflected laser beam L8, that are re-irradiated on the target film 21, may be focused on the surface of the target film 21.

With the exception of the configuration of the reflection unit 30, the configuration of the laser crystallization device 104 may be the same as that of the laser crystallization device 103. Accordingly, a repeated description thereof will be omitted for brevity.

Figure 6A:
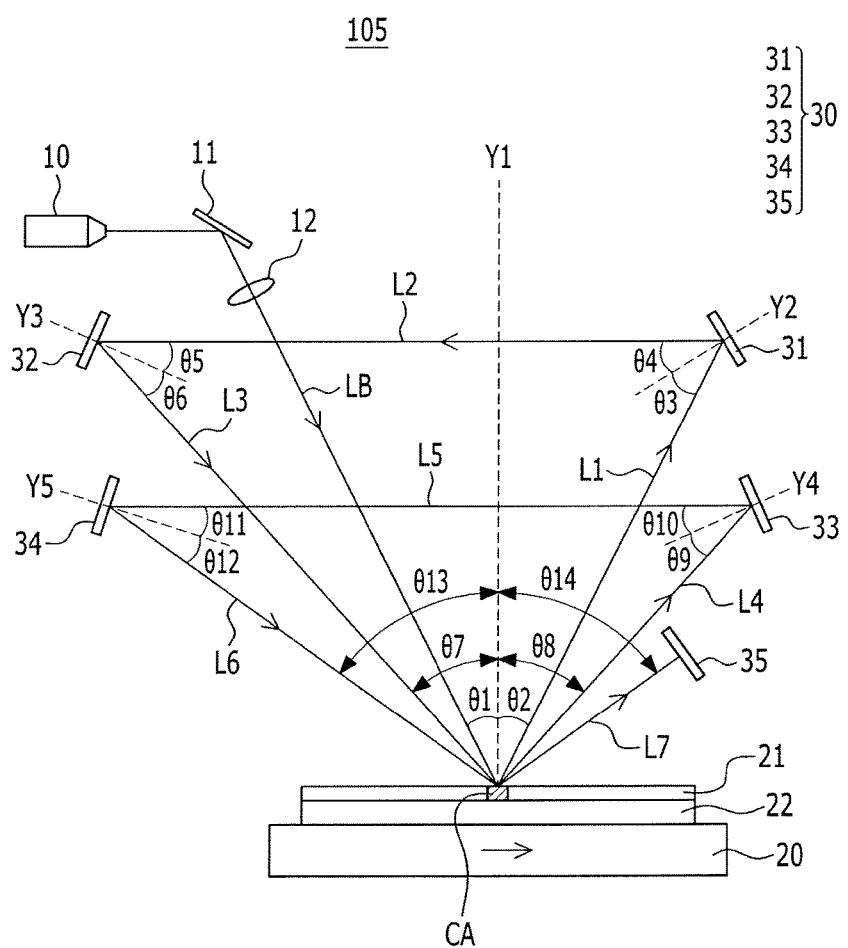
FIG. 6A and FIG. 6B are diagrams illustrating a laser crystallization device according to an exemplary embodiment of the present invention.
Figure 6B:
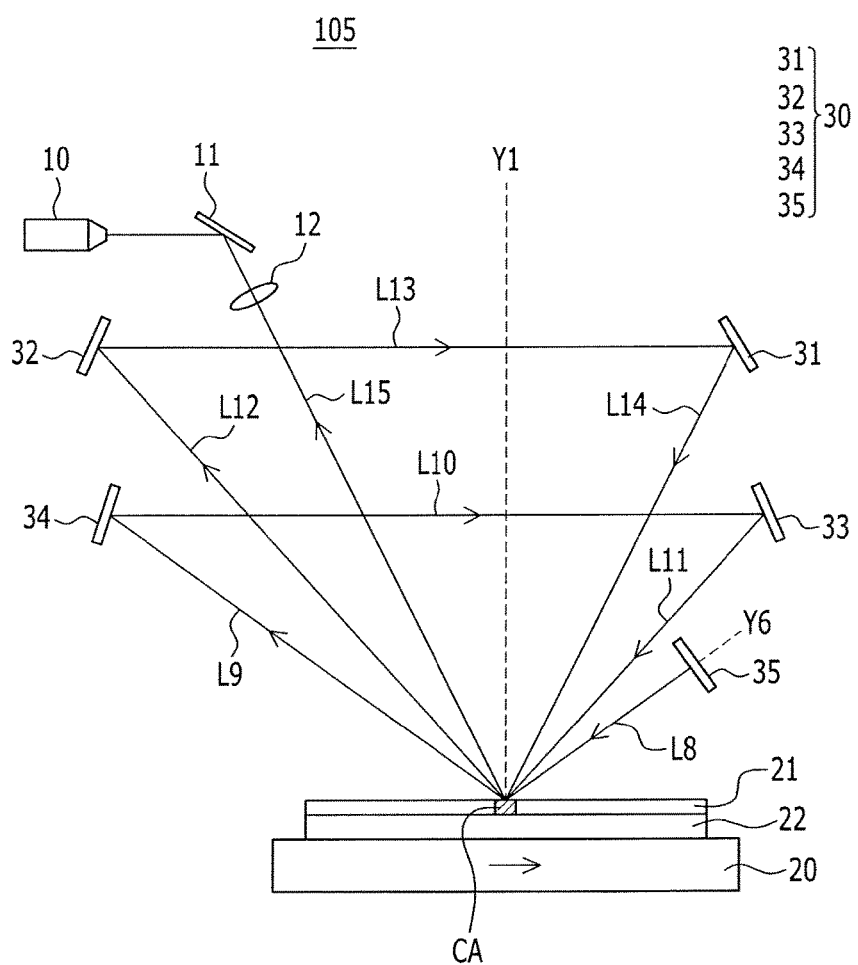

FIG. 6A and FIG. 6B are diagrams illustrating a laser crystallization device according to an exemplary embodiment of the present invention.

Referring to FIG. 6A and FIG. 6B, in a laser crystallization device 105, according to an exemplary embodiment of the present invention, the reflection unit 30 includes the first reflection mirror 31, the second reflection mirror 32, the third reflection mirror 33, a fourth reflection mirror 34, and a fifth reflection mirror 35. Each of the first to fifth reflection mirrors 31, 32, 33, 34, and 35 may include a flat mirror.

The first reflection mirror 31 is positioned at the path of travel of the first reflected laser beam L1, and reflects the first reflected laser beam L1 in the horizontal direction to generate the second reflected laser beam L2. The second reflected laser beam L2 may have a path of travel parallel to the surface of the target film 21.

The incident angle θ3 of the first reflected laser beam L1 and the reflection angle θ4 of the second reflected laser beam L2 are the same with respect to the first reflection mirror 31. The incident angle θ3 may mean the inclination angle of the first reflected laser beam L1 with respect to the second normal line Y2, which is perpendicular to the surface of the first reflection mirror 31. The reflection angle θ4 may mean the inclination angle of the second reflected laser beam L2 with respect to the second normal line Y2.

The second reflection mirror 32 is positioned at the path of travel of the second reflected laser beam L2, and reflects the second reflected laser beam L2 toward the target film 21 to generate the third reflected laser beam L3. The third reflected laser beam L3 may be re-irradiated to the target film 21. The first reflection mirror 31 and the second reflection mirror 32 are spaced apart from each other along the direction parallel to the surface of the target film 21.

The incident angle θ5 of the second reflected laser beam L2 and the reflection angle θ6 of the third reflected laser beam L3 are the same with respect to the second reflection mirror 32. The incident angle θ5 may mean the inclination angle of the second reflected laser beam L2 with respect to the third normal line Y3, which is perpendicular to the surface of the second reflection mirror 32. The reflection angle θ6 may mean the inclination angle of the third reflected laser beam L3 with respect to the third normal line Y3.

When the third reflected laser beam L3 is incident on the target film 21, a portion of the third reflected laser beam L3 is reflected to become a fourth reflected laser beam L4. The energy of the fourth reflected laser beam L4 is about 60% of that of the third reflected laser beam L3.

The incident angle θ7 of the third incident laser beam L3 and the reflection angle θ8 of the fourth reflected laser beam L4 are the same with respect to the target film 21. The incident angle θ7 may mean the inclination angle of the third reflected laser beam L3 with respect to the first normal line Y1, which is perpendicular to the surface of the substrate 22. The reflection angle θ8 may mean the inclination angle of the fourth reflected laser beam L4 with respect to the first normal line Y1. In this case, the incident angle θ7 of the third reflected laser beam L3 is greater than the incident angle θ1 of the incident laser beam LB, and the reflection angle θ8 of the fourth reflected laser beam L4 is greater than the reflection angle θ2 of the first reflected laser beam L1.

The third reflection mirror 33 is positioned at the path of travel of the fourth reflected laser beam L4, and reflects the fourth reflected laser beam L4 in the horizontal direction to generate the fifth reflected laser beam L5. The fifth reflected laser beam L5 may have a path of travel parallel to the surface of the target film 21.

An incident angle θ9 of the fourth reflected laser beam L4 and a reflection angle θ10 of the fifth reflected laser beam L5 are the same with respect to the third reflection mirror 33. The incident angle θ9 may mean the inclination angle of the fourth reflected laser beam L4 with respect to the fourth normal line Y4, which is perpendicular to the surface of the third reflection mirror 33. The reflection angle θ10 may mean an inclination angle of the fifth reflected laser beam L5 with respect to the fourth normal line Y4.

The fourth reflection mirror 34 is positioned at the path of travel of the fifth reflected laser beam L5, and reflects the fifth reflected laser beam L5 toward the target film 21 to generate the sixth reflected laser beam L6. The sixth reflected laser beam L6 may be re-irradiated on the target film 21. The third reflection mirror 33 and the fourth reflection mirror 34 are spaced apart from each other along the direction parallel to the surface of the target film 21, and are positioned to be closer to the target film 21 than the first reflection mirror 31 and the second reflection mirror 32.

An incident angle θ11 of the fifth reflected laser beam L5 and a reflection angle θ12 of the sixth reflected laser beam L6 are the same with respect to the fourth reflection mirror 34. The incident angle θ11 may mean an inclination angle of the fifth reflected laser beam L5 with respect to a fifth normal line Y5, which is perpendicular to the fourth reflection mirror 34. The reflection angle θ12 may mean an inclination angle of the sixth reflected laser beam L6 with respect to the fifth normal line Y5.

When the sixth reflected laser beam L6 is incident on the target film 21, a portion of the sixth reflected laser beam L6 is reflected to become a seventh reflected laser beam L7. The energy of the seventh reflected laser beam L7 is about 60% of that of the sixth reflected laser beam L6.

An incident angle θ13 of the sixth incident laser beam L6 and a reflection angle θ14 of the seventh reflected laser beam L7 are the same with respect to the target film 21. The incident angle θ13 may mean the inclination angle of the sixth reflected laser beam L6 with respect to the first normal line Y1, and the reflection angle θ14 may mean an inclination angle of the seventh reflected laser beam L7 with respect to the first normal line Y1. In this case, the incident angle θ13 of the sixth reflected laser beam L6 is greater than the incident angle θ7 of the third reflected laser beam L3, and the reflection angle θ14 of the seventh reflected laser beam L7 is greater than the reflection angle θ8 of the fourth reflected laser beam L4.

The fifth reflection mirror 35 is positioned at a path of travel of the seventh reflected laser beam L7, and reflects the seventh reflected laser beam L7 toward the target film 21 to generate an eighth reflected laser beam L8. The eighth reflected laser beam L8 may be re-irradiated to the target film 21. The fifth reflection mirror 35 is positioned to be closer to the target film 21 than the third reflection mirror 33. A path of travel of the eighth reflected laser beam L8 may be the same as that of the seventh reflected laser beam L7. For this to occur, the fifth reflection mirror 35 may be installed so that a sixth normal line Y6, which is perpendicular to a surface of the fifth reflection mirror 35, is identical to the path of travel of the seventh reflected laser beam L7.

When the target film 21 is incident on the eighth reflected laser beam L8, a portion of the eighth reflected laser beam L8 is reflected to become a ninth reflected laser beam L9. The energy of the ninth reflected laser beam L9 is about 60% of that of the eighth reflected laser beam L8, and a path of travel of the ninth reflected laser beam L9 may be the same as that of the sixth reflected laser beam L6.

The fourth reflection mirror 34 reflects the ninth reflected laser beam L9 in the horizontal direction to generate a tenth reflected laser beam L10. A path of travel of the tenth reflected laser beam L10 may be the same as that of the fifth reflected laser beam L5. The third reflection mirror 33 reflects the tenth reflected laser beam L10 toward the target film 21 to generate an eleventh reflected laser beam L11. The eleventh reflected laser beam L11 may be re-irradiated to the target film 21.

When the eleventh reflected laser beam L11 is incident on the target film 21, a portion of the eleventh reflected laser beam L11 is reflected to become a twelfth reflected laser beam L12. The energy of the twelfth reflected laser beam L12 is about 60% of that of the eleventh reflected laser beam L11, and a path of travel of the twelfth reflected laser beam L12 may be the same as that of the third reflected laser beam L3.

The second reflection mirror 32 reflects the twelfth reflected laser beam L12 in the horizontal direction to generate a thirteenth reflected laser beam L13. A path of travel of the thirteenth reflected laser beam L13 may be the same as that of the second reflected laser beam L2. The first reflection mirror 31 reflects the thirteenth reflected laser beam L13 toward the target film 21 to generate a fourteenth reflected laser beam L14. The fourteenth reflected laser beam L14 may be re-irradiated on the target film 21.

When the fourteenth reflected laser beam L14 is incident on the target film 21, a portion of the fourteenth reflected laser beam L14 is reflected to become a fifteenth reflected laser beam L15. The energy of the fifteenth reflected laser beam L15 is about 60% of that of the fourteenth reflected laser beam L14, and a path of travel of the fifteenth reflected laser beam L15 may be the same as that of the incident laser beam LB.

Accordingly, the reflection unit 30 controls the third reflected laser beam L3, the sixth reflected laser beam L6, the eighth reflected laser beam L8, the eleventh reflected laser beam L11, and the fourteenth reflected laser beam L14 to be sequentially irradiated to the position of the target film 21 on which the incident laser beam LB is irradiated. In this case, the third reflected laser beam L3, the sixth reflected laser beam L6, the eighth reflected laser beam L8, the eleventh reflected laser beam L11, and the fourteenth reflected laser beam L14 are irradiated on the target film 21 through different travel paths.

The crystallization area (CA) of the target film 21 is crystallized by the incident laser beam LB, and it is additionally crystallized by the third reflected laser beam L3, the sixth reflected laser beam L6, the eighth reflected laser beam L8, the eleventh reflected laser beam L11, and the fourteenth reflected laser beam L14. When it is assumed that the laser reflectance of the target film 21 is about 60%, about 95.4% of the energy of the incident laser beam LB is used for the crystallization of the target film 21.

The energy of the fifteenth reflected laser beam L15 toward the laser oscillator 10 is about 4.6% of the energy of the incident laser beam LB, which is a low level of energy. Accordingly, in the laser crystallization device 105, damage of the condensing lens 12 due to the irradiation of the seventh reflected laser beam L7 may be reduced. In addition the oscillation instability of the laser beam emitted from the laser oscillator 10 may be minimized by reducing the energy of the reflected laser beam entering the laser oscillator 10.

In the aforementioned exemplary embodiment, irradiation areas of the third reflected laser beam L3, the sixth reflected laser beam L6, the eighth reflected laser beam L8, the eleventh reflected laser beam L11, and the fourteenth reflected laser beam L14 may be identical to or partially overlap the irradiation area of the incident laser beam LB.

When the travel paths of the eighth, ninth, tenth, eleventh, twelfth, thirteenth, and fourteenth reflected laser beams L8, L9, L10, L11, L12, L13, and L14 are respectively the same as those of the seventh, sixth, fifth, fourth, third, second, and first reflected laser beams L7, L6, L5, L4, L3, L2, and L1, the irradiation areas of the third reflected laser beam L3, the sixth reflected laser beam L6, the eighth reflected laser beam L8, the eleventh reflected laser beam L11, and the fourteenth reflected laser beam L14 may be identical to the irradiation area of the incident laser beam LB.

The first reflection mirror 31, the second reflection mirror 32, the third reflection mirror 33, the fourth reflection mirror 34, and/or the fifth reflection mirror 35 may have a tilt angle of about 0.5° or less with respect to a reference position. The reference position means a position at which irradiation areas of the third reflected laser beam L3, the sixth reflected laser beam L6, the eighth reflected laser beam L8, the eleventh reflected laser beam L11, and the fourteenth reflected laser beam L14 are identical to the irradiation area of the incident laser beam LB.

In this case, the travel paths of the eighth, ninth, tenth, eleventh, twelfth, thirteenth, and fourteenth reflected laser beams L8, L9, L10, L11, L12, L13, and L14 are respectively deviated from those of the seventh, sixth, fifth, fourth, third, second, and first reflected laser beams L7, L6, L5, L4, L3, L2, and L1. Each of the irradiation areas of the third reflected laser beam L3, the sixth reflected laser beam L6, the eighth reflected laser beam L8, the eleventh reflected laser beam L11, and the fourteenth reflected laser beam L14 may partially overlap the irradiation area of the incident laser beam LB.

With the exception of the configuration of the reflection unit 30, the configuration of the laser crystallization device 105 may be the same as that of the laser crystallization device 101. Accordingly, a repeated description thereof will be omitted for brevity.

Figure 7:
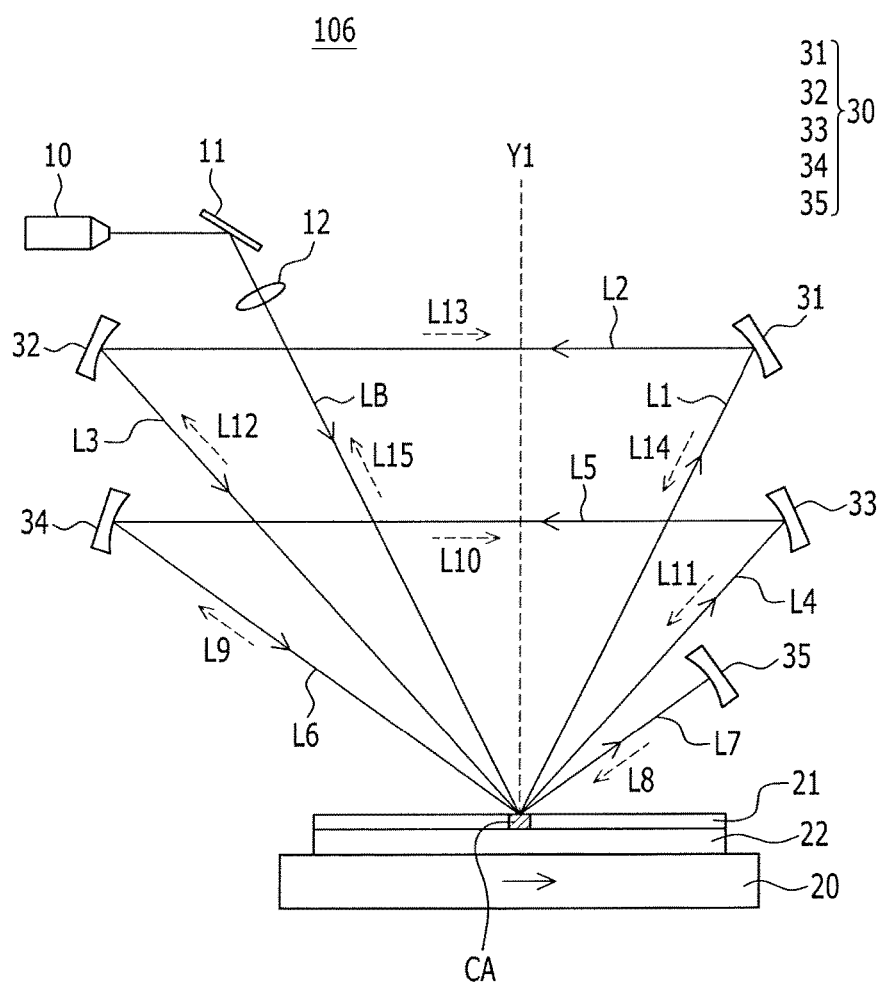
FIG. 7 is a diagram illustrating a laser crystallization device according to an exemplary embodiment of the present invention.

FIG. 7 is a diagram illustrating a laser crystallization device according to an exemplary embodiment of the present invention.

Referring to FIG. 7, in a laser crystallization device 106, according to an exemplary embodiment of the present invention, the first reflection mirror 31, the second reflection mirror 32, the third reflection mirror 33, the fourth reflection mirror 34, and/or the fifth reflection mirror 35 includes a concave mirror. For example, all of the first to fifth reflection mirrors 31, 32, 33, 34, and 35 may respectively include a concave mirror, and a mirror positioned at the last of the travel paths of the plurality of reflected laser beams may include a concave reflection mirror.

In FIG. 7, the reflected laser beams L1-L15 sequentially pass the first reflection mirror 31, the second reflection mirror 32, the target film 21, the third reflection mirror 33, the fourth reflection mirror 34, the target film 21, the fifth reflection mirror 35, the target film 21, the fourth reflection mirror 34, the third reflection mirror 33, the target film 21, the second reflection mirror 32, the first reflection mirror 31, and the target film 21. The first reflection mirror 31 may include a concave mirror, and the second to fifth reflection mirrors 32, 33, 34, and 35 may respectively include a flat mirror. In FIG. 7, it is exemplarily illustrated that all of the first to fifth reflection mirrors 31, 32, 33, 34, and 35 respectively include a concave mirror.

At least one of the first to fifth reflection mirrors 31, 32, 33, 34, and 35, which includes a concave mirror, focuses the reflected laser beam. Accordingly, at least one of the third reflected laser beam L3, the sixth reflected laser beam L6, the eighth reflected laser beam L8, the eleventh reflected laser beam L11, and the fourteenth reflected laser beam L14, that are re-irradiated on the target film 21, may be focused on the surface of the target film 21.

With the exception of the concavity of the first to fifth reflection mirrors 31, 32, 33, 34, and 35 of the reflection unit 30, the configuration of the laser crystallization device 106 may be the same as that of the laser crystallization device 105. Accordingly, a repeated description thereof will be omitted for brevity.

Figure 8:
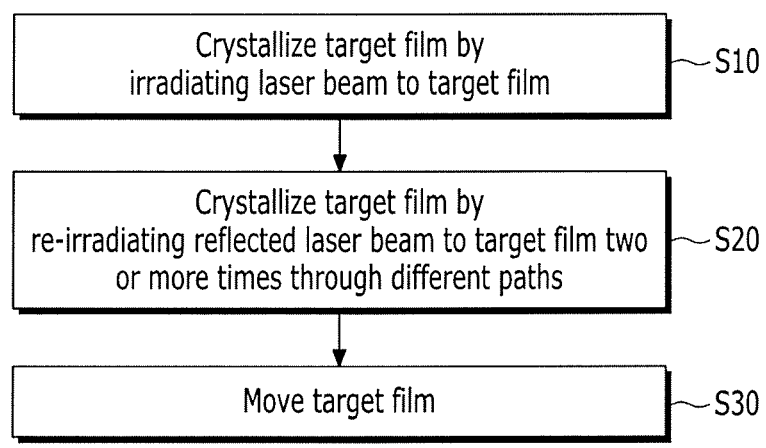
FIG. 8 is a flowchart illustrating a laser crystallization method according to an exemplary embodiment of the present invention.

FIG. 8 is a flowchart illustrating a laser crystallization method according to an exemplary embodiment of the present invention. The laser crystallization method of FIG. 8 may be performed by using the laser crystallization device 101, 102, 103, 104, 105 or 106.

Referring to FIG. 8, the laser crystallization method includes a first operation of crystallizing a target film by irradiating a laser beam to a target film (S10), a second operation of crystallizing the target film by re-irradiating a reflected laser beam to the target film two or more times through different travel paths (S20), and a third operation of moving the target film (S30).

In the first operation (S10), the incident laser beam LB emitted from the laser oscillator 10 is irradiated to the target film 21 such that a predetermined portion of the target film 21 is crystallized. In this case, about 40% of the energy of the incident laser beam LB is used for the crystallization, and the remaining energy of the incident laser beam LB is reflected.

In the second operation (S20), the reflection unit 30, including at least two reflection mirrors, is positioned at the path of travel of the reflected laser beam. The reflection unit 30 re-irradiates the portion of the incident laser beam LB that was reflected from the target film 21 back onto the target film 21 two or more times through different travel paths. The second crystallization may mean an additional crystallization process performed by the re-irradiated laser beam (e.g., the portion of the incident laser beam LB that was reflected from the target film 21). The irradiation area of the re-irradiated laser beam may be identical to or partially overlap the irradiation area of the incident laser beam LB.

In the third operation (S30), the stage 20 moves the substrate 22 and the target film 21 such that the incident laser beam LB and the re-irradiated laser beam may scan the target film 21.

According to the laser crystallization method of FIG. 8, since the utilization of the laser energy used for the crystallization process increases, the output of the laser oscillator 10 may be reduced. In addition the damage of the condensing lens 12 and the oscillation instability of the laser beam may be minimized by reducing the energy of the reflected laser beam entering the laser oscillator 10.

Figure 9:
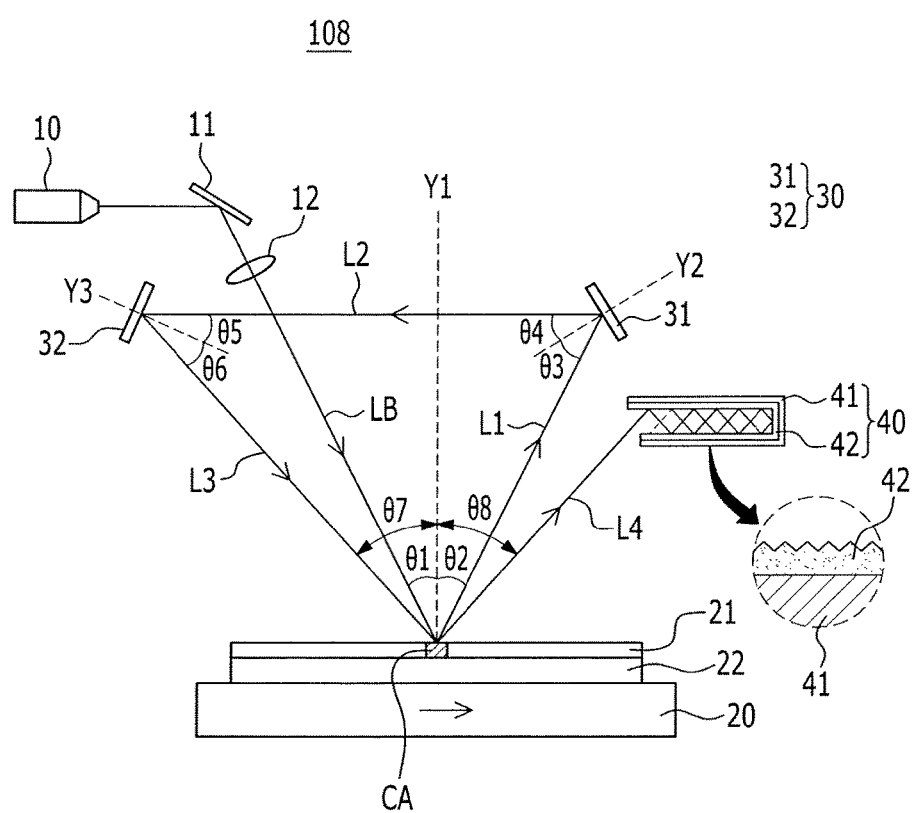
FIG. 9 is a diagram illustrating a laser crystallization device according to an exemplary embodiment of the present invention.

FIG. 9 is a diagram illustrating a laser crystallization device according to an exemplary embodiment of the present invention.

Referring to FIG. 9, in a laser crystallization device 108, according to an exemplary embodiment of the present invention, the reflection unit 30 includes the first reflection mirror 31 and the second reflection mirror 32. The first reflection mirror 31 and the second reflection mirror 32 may be flat mirrors. The laser crystallization device 108 includes a laser canceller 40. The first reflection mirror 31 is positioned at the path of travel of the first reflected laser beam L1, and reflects the first reflected laser beam L1 in a horizontal direction to generate the second reflected laser beam L2. The second reflected laser beam L2 may have a path of travel parallel to the surface of the target film 21.

The incident angle $\theta 3$ of the first reflected laser beam L1 and the reflection angle $\theta 4$ of the second reflected laser beam L2 are the same with respect to the first reflection mirror 31. The incident angle $\theta 3$ may mean the inclination angle of the first reflected laser beam L1 with respect to the second normal line Y2, which is perpendicular to the surface of the first reflection mirror 31. The reflection angle $\theta 4$ may mean the inclination angle of the second reflected laser beam L2 with respect to the second normal line Y2.

The second reflection mirror 32 is positioned at the path of travel of the second reflected laser beam L2, and reflects the second reflected laser beam L2 toward the target film 21 to generate the third reflected laser beam L3. The third reflected laser beam L3 may be re-irradiated to the target film 21. The first reflection mirror 31 and the second reflection mirror 32 are spaced apart from each other along the direction parallel to the surface of the target film 21.

The incident angle $\theta 5$ of the second reflected laser beam L2 and the reflection angle $\theta 6$ of the third reflected laser beam L3 are the same with respect to the second reflection mirror 32. The incident angle $\theta 5$ may mean the inclination angle of the second reflected laser beam L2 with respect to the third normal line Y3, which is perpendicular to the surface of the second reflection mirror 32. The reflection angle θ6 may mean the inclination angle of the third reflected laser beam L3 with respect to the third normal line Y3.

When the third reflected laser beam L3 is incident on the target film 21, a portion of the third reflected laser beam L3 is reflected to become a fourth reflected laser beam L4. The energy of the fourth reflected laser beam L4 is about 60% of that of the third reflected laser beam L3.

The incident angle θ7 of the third incident laser beam L3 and the reflection angle θ8 of the fourth reflected laser beam L4 are the same with respect to the target film 21. The incident angle θ7 may mean the inclination angle of the third reflected laser beam L3 with respect to the first normal line Y1, which is perpendicular to the surface of the substrate 22. The reflection angle θ8 may mean the inclination angle of the fourth reflected laser beam L4 with respect to the first normal line Y1. In this case, the incident angle θ7 of the third reflected laser beam L3 is greater than the incident angle θ1 of the incident laser beam LB, and the reflection angle θ8 of the fourth reflected laser beam L4 is greater than the reflection angle θ2 of the first reflected laser beam L1.

The laser canceller 40 is positioned at the path of travel of the fourth reflected laser beam L4, and traps and cancels the fourth reflected laser beam L4 therein. The laser canceller 40 may include a main body 41, which has an opening, and a reflection film 42, which is formed in the opening (e.g., on an inner surface of the opening) of the main body 41. The reflection film 42, which may include a metal such as aluminum (Al), copper (Cu), or the like, is not damaged by the laser beam. The reflection film 42 includes superficial protrusions and depressions for causing a diffused reflection of the laser beam.

The fourth reflected laser beam L4 is incident on the inside of the main body 41 through the entrance of the laser canceller 40, and then collides with the reflection film 42 and continuously undergoes a diffused reflection. During such process, the energy of the fourth reflected laser beam L4 is converted into thermal energy. Thus, the fourth reflected laser beam L4 is gradually extinguished.

The reflection unit 30 re-irradiates the third reflected laser beam L3 at the position of the target film 21 where the incident laser beam LB is irradiated. In this case, the third reflected laser beam L3 is irradiated on the target film 21 through a different path of travel than the travel paths of the incident laser beam LB and the first reflected laser beam L1. The crystallization area (CA) of the target film 21 is crystallized by the incident laser beam LB, and it is additionally crystallized by the third reflected laser beam L3. When it is assumed that the laser reflectance of the target film 21 is about 60%, about 64% of the energy of the incident laser beam LB is used for the crystallization.

The laser canceller 40 cancels the fourth reflected laser beam L4, and prevents the reflected laser beam from entering the laser oscillator 10. For example, in an exemplary embodiment of the present invention, since there is no reflected laser beam reentering the path of travel of the incident laser beam LB, damage of the condensing lens 12 and oscillation instability of the laser beam emitted from the laser crystallization device 108 may be prevented.

In the exemplary embodiment described with reference to FIG. 9, the irradiation area of the third reflected laser beam L3 may be identical to that of the incident laser beam LB. The first reflection mirror 31, the second reflection mirror 32, and the third reflection mirror 33 may have a tilt angle of about 0.5° or less with respect to a reference position. The reference position may correspond to a position of the target film 21 where the irradiation area of the third reflected laser beam L3 is identical to that of the incident laser beam LB. In this case, the irradiation area of the third reflected laser beam L3 may partially overlap the irradiation area of the incident laser beam LB.

With the exception of the reflection unit 30 and the laser canceller 40, the configuration of the laser crystallization device 108 is the same as that of the laser crystallization device 101. Accordingly, a repeated description thereof will be omitted for brevity.

Figure 10:
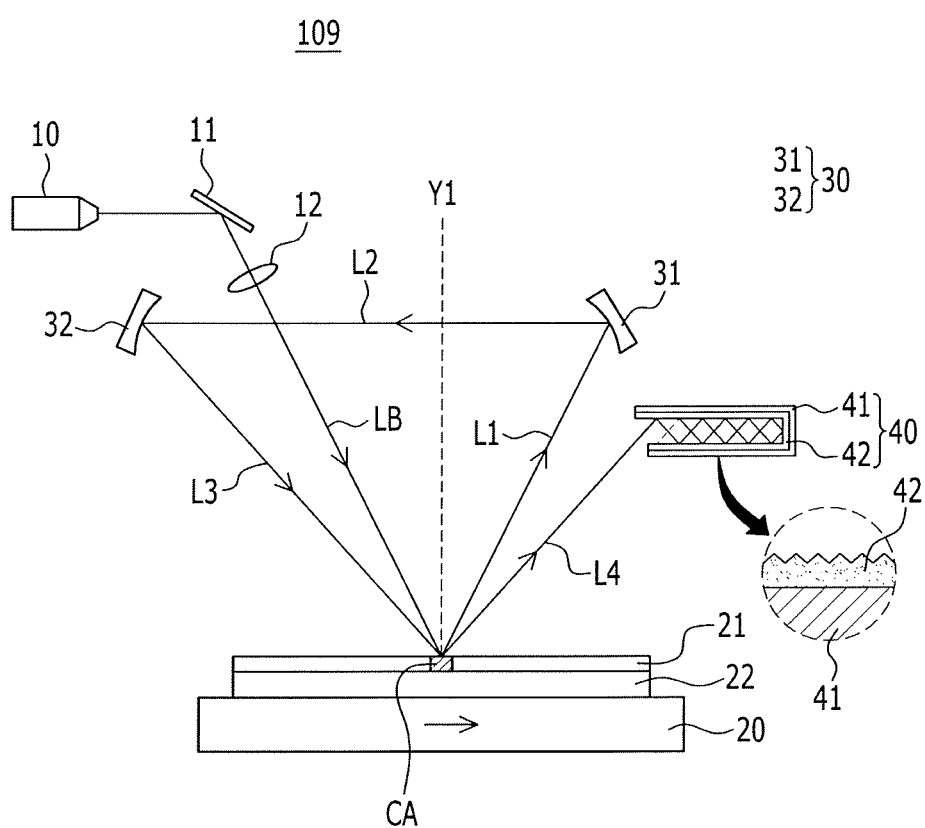
FIG. 10 is a diagram illustrating a laser crystallization device according to an exemplary embodiment of the present invention.

FIG. 10 is a diagram illustrating a laser crystallization device according to an exemplary embodiment of the present invention.

Referring to FIG. 10, in a laser crystallization device 109, in an exemplary embodiment of the present invention, the first reflection mirror 31 and/or the second reflection mirror 32 includes a concave mirror. For example, both the first reflection mirror 31 and the second reflection mirror 32 may respectively include a concave mirror, and a mirror positioned at the last of travel paths of the plurality of reflected laser beams may include a concave reflection mirror.

In FIG. 10, the reflected laser beams L1-L4 sequentially pass the first reflection mirror 31, the second reflection mirror 32, and the target film 21. The second reflection mirror 32 may include a concave mirror, and the first reflection mirror 31 may include a flat mirror. In FIG. 10, it is exemplarily illustrated that both the first reflection mirror 31 and the second reflection mirror 32 respectively include a concave mirror.

The first reflection mirror 31 and/or the second reflection mirror 32 may include a concave mirror and may focus the reflected laser beam. Accordingly, the third reflected laser beam L3 that is re-irradiated on the target film 21 may be focused on the surface of the target film 21.

With the exception of the concavity of the first and second reflection mirrors 31 and 32 of the reflection unit 30, the configuration of the laser crystallization device 109 may be the same as that of the laser crystallization device 108. Accordingly, a repeated description thereof will be omitted for brevity.

Figure 11:
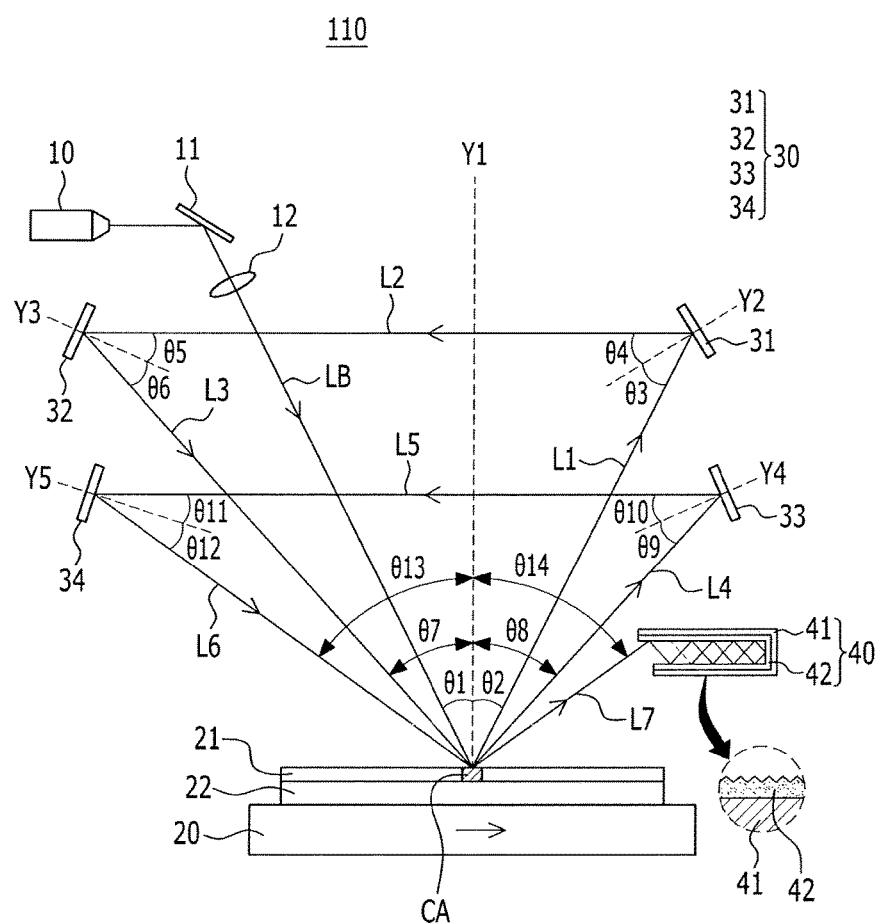
FIG. 11 is a diagram illustrating a laser crystallization device according to an exemplary embodiment of the present invention.

FIG. 11 is a diagram illustrating a laser crystallization device according to an exemplary embodiment of the present invention.

Referring to FIG. 11, in a laser crystallization device 110, according to an exemplary embodiment of the present invention, the reflection unit 30 includes the first reflection mirror 31, the second reflection mirror 32, the third reflection mirror 33, and the fourth reflection mirror 34. Each of the first to fourth reflection mirrors 31, 32, 33, and 34 may be a flat mirror. The laser crystallization device 110 further includes the laser canceller 40.

The first reflection mirror 31 is positioned at the path of travel of the first reflected laser beam L1, and reflects the first reflected laser beam L1 in a horizontal direction to generate the second reflected laser beam L2. The second reflected laser beam L2 has the path of travel parallel to the surface of the target film 21.

The incident angle θ3 of the first reflected laser beam L1 and the reflection angle θ4 of the second reflected laser beam L2 are the same with respect to the first reflection mirror 31. The incident angle θ3 may mean the inclination angle of the first reflected laser beam L1 with respect to the second normal line Y2, which is perpendicular to the surface of the first reflection mirror 31. The reflection angle θ4 may mean the inclination angle of the second reflected laser beam L2 with respect to the second normal line Y2.

The second reflection mirror 32 is positioned at the path of travel of the second reflected laser beam L2, and reflects the second reflected laser beam L2 toward the target film 21 to generate the third reflected laser beam L3. The third reflected laser beam L3 is re-irradiated on the target film 21. The first reflection mirror 31 and the second reflection mirror 32 are spaced apart from each other along the direction parallel to the surface of the target film 21.

The incident angle θ5 of the second reflected laser beam L2 and the reflection angle θ6 of the third reflected laser beam L3 are the same with respect to the second reflection mirror 32. The incident angle θ5 may mean the inclination angle of the second reflected laser beam L2 with respect to the third normal line Y3, which is perpendicular to the surface of the second reflection mirror 32. The reflection angle θ6 may mean the inclination angle of the third reflected laser beam L3 with respect to the third normal line Y3.

When the third reflected laser beam L3 is incident on the target film 21, a portion of the third reflected laser beam L3 is reflected to become a fourth reflected laser beam L4. The energy of the fourth reflected laser beam L4 is about 60% of that of the third reflected laser beam L3.

The incident angle θ7 of the third incident laser beam L3 and the reflection angle θ8 of the fourth reflected laser beam L4 are the same with respect to the target film 21. The incident angle θ7 may mean the inclination angle of the third reflected laser beam L3 with respect to the first normal line Y1, which is perpendicular to the surface of the substrate 22. The reflection angle θ8 may mean the inclination angle of the fourth reflected laser beam L4 with respect to the first normal line Y1. In this case, the incident angle θ7 of the third reflected laser beam L3 is greater than the incident angle θ1 of the incident laser beam LB, and the reflection angle θ8 of the fourth reflected laser beam L4 is greater than the reflection angle θ2 of the first reflected laser beam L1.

The third reflection mirror 33 is positioned at the path of travel of the fourth reflected laser beam L4, and reflects the fourth reflected laser beam L4 in the horizontal direction to generate the fifth reflected laser beam L5 having the path of travel parallel to the surface of the target film 21.

The incident angle θ9 of the fourth reflected laser beam L4 and the reflection angle θ10 of the fifth reflected laser beam L5 are the same with respect to the third reflection mirror 33. The incident angle θ9 may mean the inclination angle of the fourth reflected laser beam L4 with respect to the fourth normal line Y4, which is perpendicular to the surface of the third reflection mirror 33. The reflection angle θ10 may mean the inclination angle of the fifth reflected laser beam L5 with respect to the fourth normal line Y4.

The fourth reflection mirror 34 is positioned at the path of travel of the fifth reflected laser beam L5, and reflects the fifth reflected laser beam L5 toward the target film 21 to generate the sixth reflected laser beam L6. The sixth reflected laser beam L6 is re-irradiated on the target film 21. The third reflection mirror 33 and the fourth reflection mirror 34 are spaced apart from each other along the direction parallel to the surface of the target film 21. The third reflection mirror 33 and the fourth reflection mirror 34 are positioned closer to the target film 21 than the first reflection mirror 31 and the second reflection mirror 32.

The incident angle θ11 of the fifth reflected laser beam L5 and the reflection angle θ12 of the sixth reflected laser beam L6 are the same with respect to the fourth reflection mirror 34. The incident angle θ11 may mean the inclination angle of the fifth reflected laser beam L5 with respect to the fifth normal line Y5, which is perpendicular to the fourth reflection mirror 34. The reflection angle θ12 may mean the inclination angle of the sixth reflected laser beam L6 with respect to the fifth normal line Y5.

When the sixth reflected laser beam L6 is incident on the target film 21, a portion of the sixth reflected laser beam L6 is reflected to become a seventh reflected laser beam L7. The energy of the seventh reflected laser beam L7 is about 60% of that of the sixth reflected laser beam L6.

An incident angle θ13 of the sixth incident laser beam L6 and a reflection angle θ14 of the seventh reflected laser beam L7 are the same with respect to the target film 21. The incident angle θ13 may mean the inclination angle of the sixth reflected laser beam L6 with respect to the first normal line Y1, and the reflection angle θ14 may mean the inclination angle of the seventh reflected laser beam L7 with respect to the first normal line Y1. In this case, the incident angle θ13 of the sixth reflected laser beam L6 is greater than the incident angle θ7 of the third reflected laser beam L3, and the reflection angle θ14 of the seventh reflected laser beam L7 is greater than the reflection angle θ8 of the fourth reflected laser beam L4.

The laser canceller 40 is positioned at the path of travel of the seventh reflected laser beam L7, and traps and cancels the seventh reflected laser beam L7 therein. The laser canceller 40 may include a main body 41 in which an inner space connected with an entrance of the laser canceller is formed, and a reflection film 42 formed at an inner surface of the main body 41. The reflection film 42 may include a metal such as aluminum (Al), copper (Cu), or the like. The reflection film 42 is not damaged by the laser beam. The reflection film 42 includes superficial protrusions and depressions for causing a diffused reflection of the laser beam.

The seventh reflected laser beam L7 is incident on the inside of the main body 41 through the entrance of the laser canceller 40, and then collides with the reflection film 42 and continuously undergoes a diffused reflection. During such process, the energy of the seventh reflected laser beam L7 is converted into thermal energy. Thus, the seventh reflected laser beam L7 is gradually extinguished.

The reflection unit 30 controls the third reflected laser beam L3 and the sixth reflected laser beam L6, which are sequentially irradiated on the same position of the target film 21 on which the incident laser beam LB is irradiated. In this case, the third reflected laser beam L3 and the sixth reflected laser beam L6 are irradiated on the target film 21 through the different travel paths from those of the incident laser beam LB and the first reflected laser beam L1. The crystallization area (CA) of the target film 21 is crystallized by the incident laser beam LB, and it is additionally crystallized by the third reflected laser beam L3 and the sixth reflected laser beam L6 that are re-irradiated. When it is assumed that the laser reflectance of the target film 21 is about 60%, about 78.4% of the energy of the incident laser beam LB is used for the crystallization.

The laser canceller 40 cancels the seventh reflected laser beam L7, thereby preventing the reflected laser beam from entering the laser oscillator 10. Since there is no reflected laser beam re-entering the path of travel of the incident laser beam LB, damage of the condensing lens 12 may be prevented. In addition, since there is no reflected laser beam re-entering the path of travel of the incident laser beam LB, the oscillation instability of the laser beam emitted from the laser oscillator 10 may be prevented.

In the laser crystallization device 110, the irradiation areas of the third reflected laser beam L3 and the sixth reflected laser beam L6 may be identical to the irradiation area of the incident laser beam LB. The first to fourth reflection mirrors 31, 32, 33, and 34 may have a tilt angle of about 0.5° or less with respect to a reference position. The reference position means a position at which the irradiation area of the third reflected laser beam L3 and the irradiation area of the sixth reflected laser beam L6 are identical to the irradiation area of the incident laser beam LB. In this case, each of the irradiation areas of the third reflected laser beam L3 and the sixth reflected laser beam L6 may partially overlap the irradiation area of the incident laser beam LB.

With the exception of the configuration of the reflection unit 30 and the laser canceller 40, the configuration of the laser crystallization device 110 may be the same as that of the laser crystallization device 101. Accordingly, a repeated description thereof will be omitted for brevity.

Figure 12:
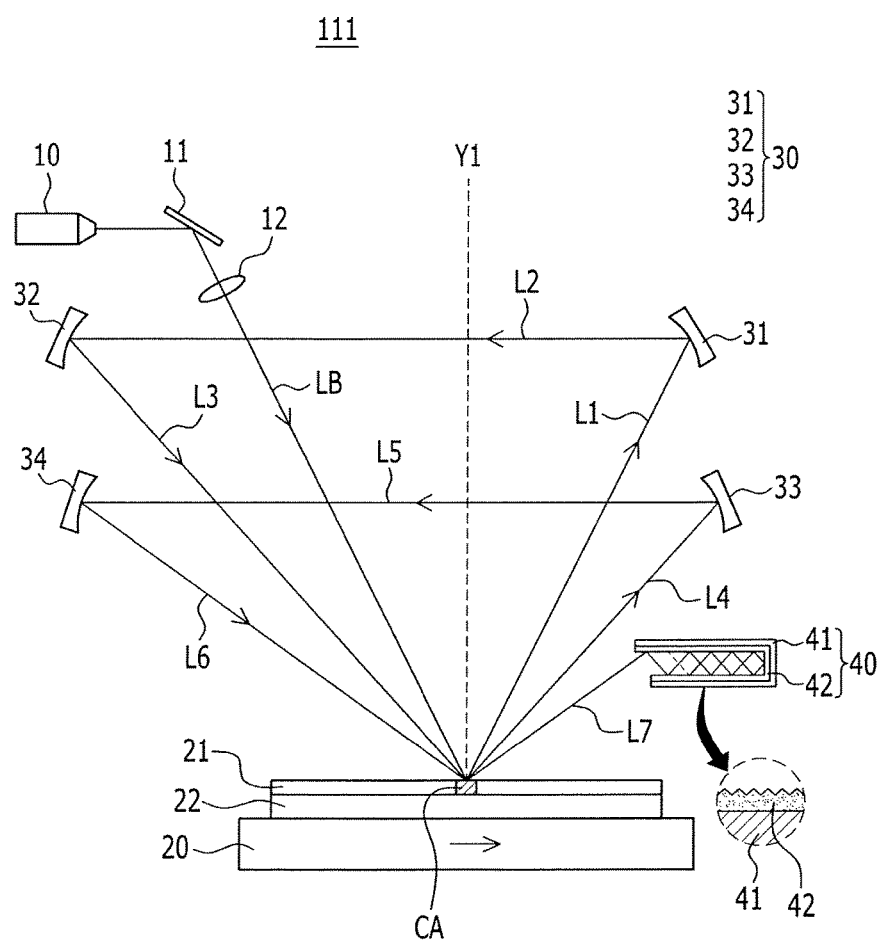
FIG. 12 is a diagram illustrating a laser crystallization device according to an exemplary embodiment of the present invention.

FIG. 12 is a diagram illustrating a laser crystallization device according to an exemplary embodiment of the present invention.

Referring to FIG. 12, in a laser crystallization device 111, according to an exemplary embodiment of the present invention, the first reflection mirror 31, the second reflection mirror 32, the third reflection mirror 33, and/or the fourth reflection mirror 34 includes a concave mirror. For example, all of the first to fourth reflection mirrors 31, 32, 33, and 34 may respectively include a concave mirror, or a mirror positioned at the last of the travel paths of a plurality of reflected laser beams may be a concave reflection mirror.

In FIG. 12, the reflected laser beams L1-L7 sequentially pass the first reflection mirror 31, the second reflection mirror 32, the target film 21, the third reflection mirror 33, the fourth reflection mirror 34, and the target film 21. The fourth reflection mirror 34 may include a concave mirror, and the first to third reflection mirrors 31, 32, and 33 may respectively include a flat mirror. In FIG. 12, it is exemplarily illustrated that all of the first to fourth reflection mirrors 31, 32, 33, and 34 respectively include a concave mirror.

At least one of the first to fourth reflection mirrors 31, 32, 33, and 34, which includes a concave mirror, focuses the reflected laser beam. Accordingly, the third reflected laser beam L3 and/or the sixth reflected laser beam L6, which are re-irradiated on the target film 21, may be focused on the surface of the target film 21.

With the exception of the concavity of the first, second, third and fourth reflection mirrors 31, 32, 33 and 34 of the reflection unit 30, the configuration of the laser crystallization device 111 may be the same as that of the laser crystallization device 110. Accordingly, a repeated description thereof will be omitted for brevity.

FIG. is a flowchart illustrating a laser crystallization method according to an exemplary embodiment of the present invention. The laser crystallization method of FIG. 8 may be performed by using the laser crystallization device 108, 109, 110 or 111.

Figure 13:
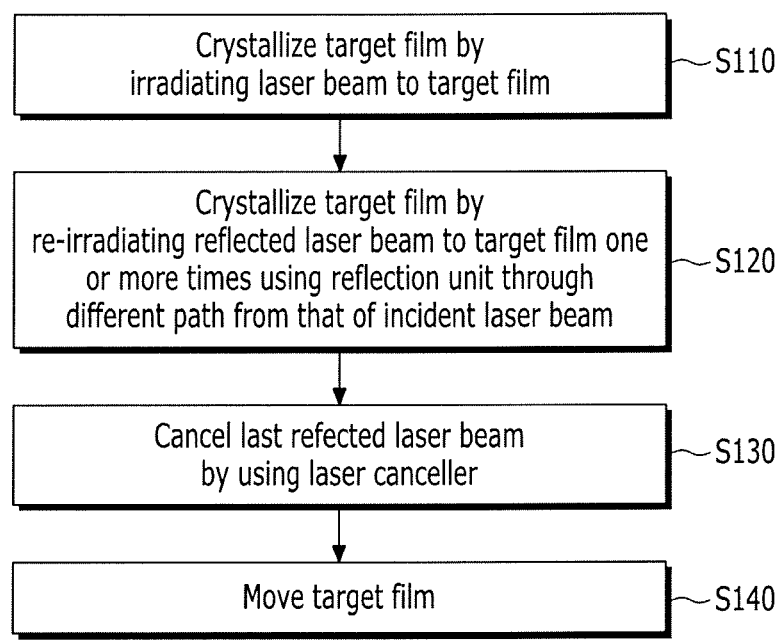
FIG. 13 is a flowchart illustrating a laser crystallization method according to an exemplary embodiment of the present invention.

Referring to FIG. 13, the laser crystallization method includes a first operation of crystallizing a target film by irradiating a laser beam to a target film (S110), a second operation of crystallizing the target film by re-irradiating a reflected laser beam on the target film one or more times through a different path of travel from that of an incident laser beam by using a reflection unit (S120), a third operation of cancelling the last laser beam that was reflected from the surface of the target film by using the reflection unit (S130), and a fourth operation of moving the target film (S140).

In the first operation (S110), the incident laser beam LB emitted from the laser oscillator 10 is irradiated on the target film 21 such that a predetermined portion of the target film 21 is crystallized. In this case, about 40% of the incident laser beam LB is used for the crystallization, and the remaining energy of the incident laser beam LB is reflected.

In the second operation (S120), the reflection unit 30 includes at least two reflection mirrors, and is positioned at the path of travel of the reflected laser beam. The reflection unit 30 re-irradiates the reflected laser beam on the target film 21 one or more times through the different path of travel from that of the incident laser beam LB Accordingly, in operation S120, an additional crystallization process is performed on the target film 21 by the re-irradiated laser beam on the target film 21. An irradiation area of the re-irradiated laser beam may be identical to or partially overlap the irradiation area of the incident laser beam LB.

In the third operation (S130), the laser canceller 40 traps and cancels the laser beam that was reflected last from the target film 21 by using the reflection unit 30. The laser beam that was reflected last from the target film 21 is incident on the laser canceller 40, collides with the reflection film 42, and continuously undergoes a diffused reflection. In this process, the energy of the last reflected laser beam is converted into thermal energy. Thus, the laser beam that was reflected last from the target film 21 is gradually extinguished.

In the laser crystallization method of FIG. 13, since the utilization of the laser energy for the crystallization process increases, the output energy of the laser oscillator 10 may be reduced and damage of the condensing lens 12 may be reduced or prevented. In addition, since there is no reflected laser beam re-entering the path of travel of the incident laser beam LB, the oscillation instability of the laser beam emitted from the laser oscillator 10 may be prevented.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A laser crystallization device comprising:
a laser oscillator;
a stage configured to support a substrate with a target film disposed on the substrate, wherein the laser oscillator is configured to irradiate an incident laser beam on the target film, wherein the stage is configured to move the substrate such that the incident laser beam scans the target film, and wherein the incident laser beam is reflected from the target film to generate a reflected laser beam; and
a reflection unit including at least two reflection mirrors positioned at a path of the reflected laser beam, wherein the reflection unit is configured to re-irradiate the reflected laser beam on the target film two or more times through a plurality of paths that are different from a path of the incident laser beam;
wherein the reflected laser beam is a first reflected laser beam,
wherein the reflection unit includes a first reflection mirror that reflects the first reflected laser beam to generate a second reflected laser beam;
wherein a path of the second reflected laser beam is different from a path of the first reflected laser beam;
wherein the reflection unit includes a second reflection mirror that is disposed farther away from the target film than the first reflection mirror;

wherein the second reflection mirror reflects the second reflected laser beam toward the target film to generate a third reflected laser beam, wherein the third reflected laser beam is irradiated on the target film; and wherein the third reflected laser beam is irradiated on the target film in a direction perpendicular to a surface of the target film.

2. The laser crystallization device of claim 1, wherein the third reflected laser beam is reflected from the target film to generate a fourth reflected laser beam, wherein the fourth reflected laser beam travels through a same path as a path of the third reflected laser beam, wherein the second reflection mirror reflects the fourth reflected laser beam to generate a fifth reflected laser beam, wherein the fifth reflected laser beam travels through a same path as the path of the second reflected laser beam, and the first reflection mirror reflects the fifth reflected laser beam to generate a sixth reflected laser beam, wherein the sixth reflected laser beam travels through a same path as the path of the first reflected laser beam and the sixth reflected laser beam is irradiated on the target film.

3. The laser crystallization device of claim 1, wherein the reflection unit includes:

a second reflection mirror spaced apart from the first reflection mirror along a direction parallel to a surface of the target film; and a third reflection mirror disposed closer to the target film than the first reflection mirror and the second reflection mirror.

4. The laser crystallization device of claim 3, wherein the second reflection mirror reflects the second reflected laser beam toward the target film to generate a third reflected laser beam, wherein the third reflected laser beam is irradiated on the target film, wherein the target film reflects the third reflected laser beam to generate a fourth reflected laser beam, wherein the third reflection mirror reflects the fourth reflected laser beam toward the target film to generate a fifth reflected laser beam, wherein the fifth reflected laser beam is irradiated on the target film, and wherein a path of the fifth reflected laser beam is the same as a path of the fourth reflected laser beam.

5. The laser crystallization device of claim 4, wherein the target film reflects the fifth reflected laser beam to generate a sixth reflected laser beam, wherein the second reflection mirror reflects the sixth reflected laser beam to generate a seventh reflected laser beam, wherein the seventh reflected laser beam has a same path as the path of the second reflected laser beam, and wherein the first reflection mirror reflects the seventh reflected laser beam to generate an eighth reflected laser beam, wherein the eighth reflected laser beam has a same path as the path of the first reflected laser beam and the eighth reflected laser beam is irradiated on the target film.

6. The laser crystallization device of claim 1, wherein at least one of the at least two reflection mirrors includes a concave mirror, and wherein an irradiation area of the reflected laser beam on the target film is identical to or partially overlaps an irradiation area of the incident laser beam.

7. A laser crystallization device, comprising:
a laser oscillator;

a stage configured to support a substrate with a target film disposed on the substrate, wherein the laser oscillator is configured to irradiate an incident laser beam on the target film, wherein the stage is configured to move the substrate such that the incident laser beam scans the target film, and wherein the incident laser beam is reflected from the target film to generate a reflected laser beam;

a reflection unit including at least two reflection mirrors positioned at a path of the reflected laser beam, wherein the reflection unit is configured to re-irradiate the reflected laser beam on the target film two or more times through a plurality of paths that are different from a path of the incident laser beam, wherein the reflected laser beam is a first reflected laser beam; and wherein the reflection unit includes:

a first reflection mirror that reflects the first reflected laser beam to generate a second reflected laser beam, wherein a path of the second reflected laser beam is different from a path of the first reflected laser beam, a second reflection mirror spaced apart from the first reflection mirror along a direction parallel to a surface of the target film;

a third reflection mirror disposed closer to the target film than the first reflection mirror and the second reflection mirror;

a fourth reflection mirror spaced apart from the third reflection mirror along the direction parallel to the surface of the target film; and a fifth reflection mirror disposed closer to the target film than the third reflection mirror and the fourth reflection mirror.

8. The laser crystallization device of claim 7, wherein the second reflection mirror reflects the second reflected laser beam toward the target film to generate a third reflected laser beam, wherein the third reflected laser beam is irradiated on the target film, wherein the target film reflects the third reflected laser beam to generate a fourth reflected laser beam toward the third reflecting mirror, wherein the third reflection mirror reflects the fourth reflected laser beam to generate a fifth reflected laser beam toward the fourth reflection mirror, wherein the fourth reflection mirror reflects the fifth reflected laser beam toward the target film to generate a sixth reflected laser beam, wherein the sixth reflected laser beam is irradiated on the target film, wherein the target film reflects the sixth reflected laser beam to generate a seventh reflected laser beam toward the fifth reflection mirror, wherein the fifth reflection mirror reflects the seventh reflected laser beam toward the target film to generate an eighth reflected laser beam, wherein the eighth reflected laser beam is irradiated on the target film, and wherein a path of the eighth reflected laser beam is the same as a path of the seventh reflected laser beam.

9. The laser crystallization device of claim 8, wherein the target film reflects the eighth reflected laser beam to generate a ninth reflection laser beam toward the fourth reflection mirror, wherein the fourth reflection mirror reflects the ninth reflected laser beam to generate a tenth reflected laser beam, wherein the tenth reflected laser beam has a same path as a path of the fifth reflected laser beam, wherein the third reflection mirror reflects the tenth reflected laser beam to generate an eleventh reflected laser beam, wherein the eleventh reflected laser beam has a same path as a path of the fourth reflected laser beam, wherein the target film reflects the eleventh reflected laser beam to generate a twelfth reflected laser beam toward the second reflection mirror, wherein the second reflection mirror reflects the twelfth reflected laser beam to generate a thirteenth reflected laser beam, wherein the thirteenth reflected laser beam has a same path as the path of the second reflected laser beam, and the first reflection mirror reflects the thirteenth reflected laser beam to generate a fourteenth reflected laser beam, wherein the fourteenth reflected laser beam has a same path as the path of the first reflected laser beam and the fourteenth laser beam is irradiated on the target film.

10. The laser crystallization device of claim 7, wherein at least one of the at least two reflection mirrors includes a concave mirror, and wherein an irradiation area of the reflected laser beam on the target film is identical to or partially overlaps an irradiation area of the incident laser beam.

11. A laser crystallization device comprising:
a laser oscillator;
a stage configured to support a substrate with a target film disposed thereon, wherein the laser oscillator irradiates an incident laser beam on the target film, wherein the stage is configured to move the substrate such that the incident laser beam scans the target film, and wherein the incident laser beam is reflected from the target film to generate a reflected laser beam;
a reflection unit including at least two reflection mirrors positioned at a path of the reflected laser beam, and wherein the reflection unit is configured to re-irradiate the reflected laser beam on the target film one or more times through a different path from a path of the incident laser beam;
wherein the reflection unit includes:
a first reflection mirror that reflects the first reflected laser beam to generate a second reflected laser beam, wherein a path of the second reflected laser beam is different from a path of the first reflected laser beam,
a second reflection mirror spaced apart from the first reflection mirror along a direction parallel to a surface of the target film;
a third reflection mirror disposed closer to the target film than the first reflection mirror and the second reflection mirror;
a fourth reflection mirror spaced apart from the third reflection mirror along the direction parallel to the surface of the target film, wherein the third and fourth reflection mirrors are disposed closer to the target film than the first and second reflection mirrors; and
a laser canceller configured to trap and cancel the reflected laser beam after the reflected laser beam has passed through the reflection unit and is next reflected from the target film.

12. The laser crystallization device of claim 11, wherein at least one of the at least two reflection mirrors includes a concave mirror, and wherein an irradiation area of the reflected laser beam on the target film is identical to or partially overlaps an irradiation area of the incident laser beam.

13. The laser crystallization device of claim 11,
wherein the second reflection mirror reflects the second reflected laser beam toward the target film to generate a third reflected laser beam, wherein the third reflected laser beam is irradiated on the target film.

14. The laser crystallization device of claim 13, wherein the laser canceller includes a reflection film which includes protrusions and depressions for diffusing the reflected laser beam, wherein the target film reflects the third reflected laser beam to generate a fourth reflected laser beam toward the laser canceller, and wherein the laser canceller traps and cancels the fourth reflected laser beam at an interior region of the laser canceller.

15. The laser crystallization device of claim 11, wherein the second reflection mirror reflects the second reflected laser beam toward the target film to generate a third reflected laser beam, wherein the third reflected laser beam is irradiated on the target film, wherein the target film reflects the third reflected laser beam to generate a fourth reflected laser beam toward the third reflection mirror, wherein the third reflection mirror reflects the fourth reflected laser beam toward the fourth reflective mirror to generate a fifth reflected laser beam, and the fourth reflection mirror reflects the fifth reflected laser beam toward the target film to generate a sixth reflected laser beam, wherein the sixth reflected laser beam is irradiated on the target film.

16. The laser crystallization device of claim 15, wherein the laser canceller includes a reflection film which includes protrusions and depressions for diffusing the reflected laser beam, and wherein the target film reflects the sixth reflected laser beam to generate a seventh reflected laser beam toward the laser canceller, and wherein the laser canceller traps and cancels the seventh reflected laser beam at an interior region of the laser canceller.

* * * * *